US00RE48032E

(19) United States
(12) Reissued Patent
Kanegae et al.

(10) Patent Number: US RE48,032 E
(45) Date of Reissued Patent: Jun. 2, 2020

(54) THIN-FILM SEMICONDUCTOR SUBSTRATE, LIGHT-EMITTING PANEL, AND METHOD OF MANUFACTURING THE THIN-FILM SEMICONDUCTOR SUBSTRATE

(71) Applicant: PANASONIC CORPORATION, Osaka (JP)

(72) Inventors: Arinobu Kanegae, Osaka (JP); Kiyoyuki Morita, Kyoto (JP)

(73) Assignee: PANASONIC CORPORATION, Osaka (JP)

(21) Appl. No.: 15/718,762

(22) Filed: Sep. 28, 2017

Related U.S. Patent Documents

Reissue of:
(64) Patent No.: 9,147,722
Issued: Sep. 29, 2015
Appl. No.: 14/541,519
Filed: Nov. 14, 2014

U.S. Applications:
(63) Continuation of application No. PCT/JP2014/000925, filed on Feb. 21, 2014.

(30) Foreign Application Priority Data

Mar. 18, 2013 (JP) ..... 2013-055675

(51) Int. Cl.
*H01L 29/66* (2006.01)
*H01L 27/12* (2006.01)
(Continued)

(52) U.S. Cl.
CPC ..... *H01L 29/66772* (2013.01); *G09F 9/30* (2013.01); *H01L 27/1225* (2013.01);
(Continued)

(58) Field of Classification Search
CPC ..... H01L 27/1225; H01L 29/7869; H01L 27/3264; H01L 29/786; H01L 27/3276;
(Continued)

(56) References Cited

U.S. PATENT DOCUMENTS 6,072,450 A 6/2000 Yamada et al.
6,359,606 B1 * 3/2002 Yudasaka ..... 345/87
(Continued)

FOREIGN PATENT DOCUMENTS

JP 09-081053 3/1997
JP 10-161564 6/1998
(Continued)

OTHER PUBLICATIONS

Search report from PCT/JP2014/00925, dated May 13, 2014.

*Primary Examiner* — Minh Nguyen
(74) *Attorney, Agent, or Firm* — Greenblum & Bernstein, P.L.C.

(57) ABSTRACT

A thin-film semiconductor substrate includes a top-gate first TFT, a top-gate second TFT, and a data line (source line), in which the first TFT has a first semiconductor layer, a first gate insulating film, a first gate electrode, a first source electrode, a first drain electrode, and a first protection layer, the second TFT has a second semiconductor layer, a second gate insulating film, a second gate electrode, a second source electrode, a second drain electrode, and a second protection layer, the data line is connected to the first source electrode, the first drain electrode is an extension of the second gate electrode, and the second gate electrode is thinner than the data line.

15 Claims, 16 Drawing Sheets

(51) Int. Cl.

| | |
|---|---|
| ***H01L 29/786*** | (2006.01) |
| ***H05B 33/26*** | (2006.01) |
| ***H05B 33/12*** | (2006.01) |
| ***H01L 27/32*** | (2006.01) |
| ***H05B 33/22*** | (2006.01) |
| ***G09F 9/30*** | (2006.01) |

(52) U.S. Cl.
CPC ..... *H01L 27/1259* (2013.01); *H01L 27/3246* (2013.01); *H01L 27/3276* (2013.01); *H01L 29/6656* (2013.01); *H01L 29/66757* (2013.01); *H01L 29/66969* (2013.01); *H01L 29/786* (2013.01); *H01L 29/7869* (2013.01); *H01L 29/78618* (2013.01); *H05B 33/12* (2013.01); *H05B 33/22* (2013.01); *H05B 33/26* (2013.01); *H01L 27/3262* (2013.01); *H01L 2227/323* (2013.01)

(58) Field of Classification Search
CPC ..... H01L 29/6656; H01L 27/3262; H01L 29/66772; H01L 29/78618; H01L 29/66757; H01L 29/66969; H01L 27/1259; H01L 2227/323; G09F 9/30; H05B 33/12; H05B 33/22; H05B 33/26
USPC ..... 257/98, 40; 445/24; 313/498
See application file for complete search history.

(56) References Cited

U.S. PATENT DOCUMENTS

| | | | | |
|---|---|---|---|---|
| 6,744,198 | B2 | 6/2004 | Hirabayashi | |
| 8,384,076 | B2 | 2/2013 | Park et al. | |
| 8,476,625 | B2 | 7/2013 | Kimura | |
| 2002/0140343 | A1 | 10/2002 | Hirabayashi | |
| 2003/0040149 | A1* | 2/2003 | Kasai | 438/200 |
| 2008/0111482 | A1* | 5/2008 | Huang | H01L 27/3246 313/504 |
| 2009/0283763 | A1 | 11/2009 | Park et al. | |
| 2010/0140613 | A1 | 6/2010 | Kimura | H01L 27/1225 257/43 |
| 2011/0240998 | A1 | 10/2011 | Morosawa et al. | |
| 2013/0280858 | A1 | 10/2013 | Kimura | |

FOREIGN PATENT DOCUMENTS

| | | |
|---|---|---|
| JP | 2001-015762 | 1/2001 |
| JP | 2002-352955 | 12/2002 |
| JP | 2009-278115 | 11/2009 |
| JP | 2010-156963 | 7/2010 |
| JP | 2011-228622 | 11/2011 |

* cited by examiner

Amended
FIG. 14
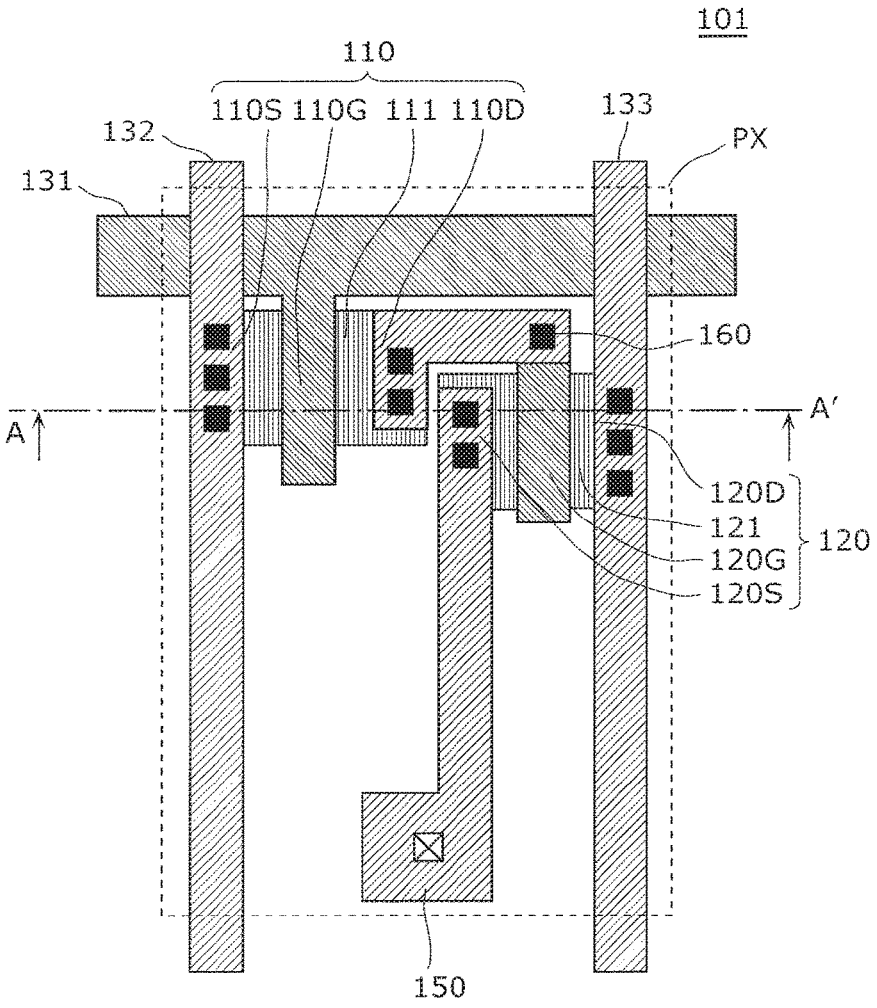
PRIOR ART

Amended
FIG. 15
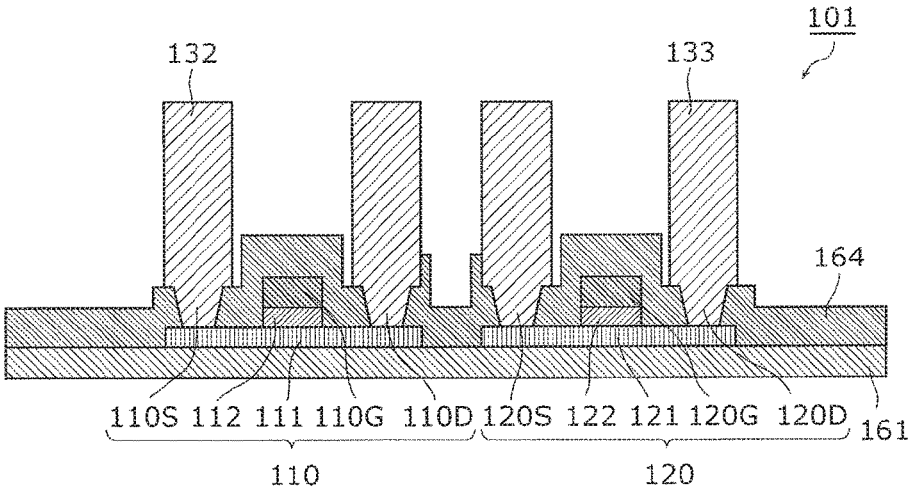
PRIOR ART
Amended
FIG. 16
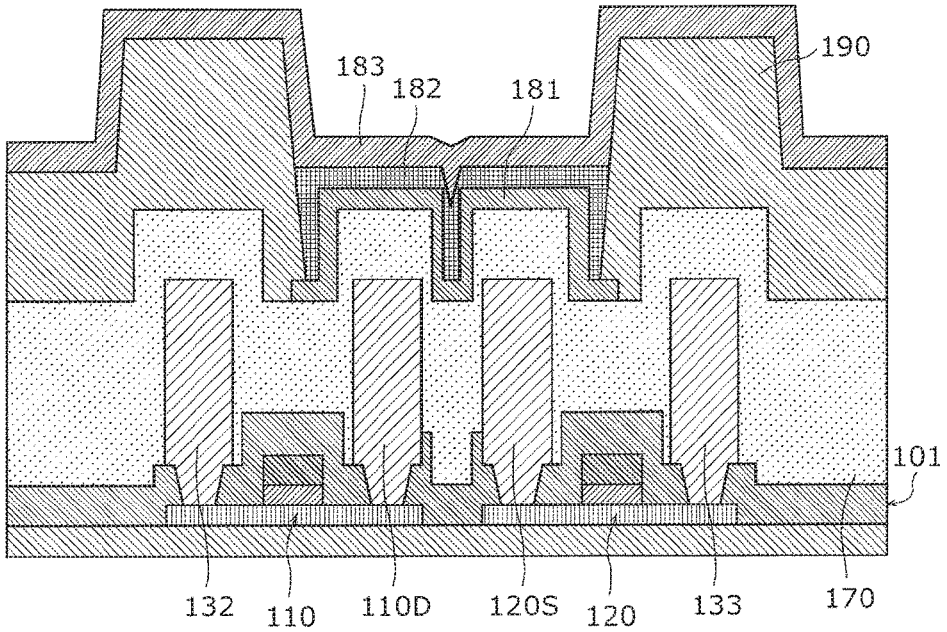
PRIOR ART

THIN-FILM SEMICONDUCTOR SUBSTRATE, LIGHT-EMITTING PANEL, AND METHOD OF MANUFACTURING THE THIN-FILM SEMICONDUCTOR SUBSTRATE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

[This] *U.S. patent application Ser. No. 14/541,519, which issued as U.S. Pat. No. 9,147,722 B2,* is a continuation application of PCT [International] Application No. PCT/JP2014/000925 filed on Feb. 21, 2014, designating the United States of America, which is based on and claims priority of Japanese Patent Application No. 2013-055675 filed on Mar. 18, 2013. The entire disclosures of the above-identified applications, including the specifications, drawings and claims are incorporated herein by reference in their entirety. *Reissue application Ser. No. 15/718,762 is a reissue of U.S. Pat. No. 9,147,722 B2.*

FIELD

One or more exemplary embodiments disclosed herein relate generally to a thin-film semiconductor substrate, a light-emitting panel, and a method of manufacturing the thin-film semiconductor substrate.

BACKGROUND

Conventionally, a thin-film semiconductor element called a thin-film transistor (TFT) is used in an active matrix display device such as a liquid crystal display device or an organic electro luminescence (EL) display device, or a solid-state imaging device such as a digital camera.

In the active matrix display device (display panel), the TFT is used as a switching transistor for selecting a pixel, a driving transistor for driving the pixel, a transistor of a driver outside the panel, or the like.

For example, unlike a voltage-driven liquid crystal display, an organic EL display having an organic EL element utilizing an EL which is an organic material is a current-driven display device, so that development of the TFT having superior performance is immediately needed.

The TFT has a gate electrode, a semiconductor layer (channel layer), a source electrode, and a drain electrode formed above a substrate. Generally, an amorphous silicon thin film or a polysilicon thin film is used for the channel layer.

In view of easiness in manufacturing, an amorphous silicon TFT in which the amorphous silicon thin film is used as the channel layer generally has so-called a bottom gate structure, in which the gate electrode is below the channel layer.

On the other hand, in order to demonstrate the performance at a maximum, a polysilicon TFT in which the polysilicon thin film is used for the channel layer generally has so-called a top gate structure, in which the gate electrode is above the channel layer.

Recent years have seen more development of TFT using an oxide semiconductor represented by In—Ga—Zn—O (IGZO) for the channel layer. As a structure of the TFT using the oxide semiconductor, the bottom gate structure, which is the same as the structure of the conventional amorphous silicon TFT, is common. Research and development is also carried out for the top gate structure having higher performance which is capable of reducing parasitic capacitance between the gate electrode and the source electrode or between the gate electrode and the drain electrode (for example, Patent Literature (PTL) 1 and 2).

CITATION LIST

Patent Literature

[PTL 1] Japanese Unexamined Patent Application Publication No. 2009-278115

[PTL 2] Japanese Unexamined Patent Application Publication No. 2011-228622

SUMMARY

Technical Problem

Above the thin-film semiconductor substrate above which the TFT is formed, wiring connected to the TFT is formed. It is beneficial for such wiring to be thick so that the wiring has low resistance. Moreover, an upper layer such as an EL layer is formed above the TFT. In this case, it is beneficial to make the upper layer flat. However, it is difficult to have both wiring having low resistance and a flat upper layer.

One non-limiting and exemplary embodiment provides a thin-film semiconductor substrate, a light-emitting panel, and a method of manufacturing the thin-film semiconductor substrate which allow the wiring connected to the TFT to have low resistance and the flatness of the upper layer above the TFT to be easily ensured.

Solution to Problem

In one general aspect, the techniques disclosed here feature a thin-film semiconductor substrate, including: a substrate; a first semiconductor element and a second semiconductor element that are above the substrate; and a data line above the substrate, in which the first semiconductor element includes: a first semiconductor layer; a first gate insulating film above the first semiconductor layer; a first gate electrode above the first gate insulating film; a first source electrode and a first drain electrode each connected to a corresponding part of the first semiconductor layer; and a first protection layer above the first gate electrode, the second semiconductor element includes: a second semiconductor layer; a second gate insulating film above the second semiconductor layer; a second gate electrode above the second gate insulating film; a second source electrode and a second drain electrode each connected to a corresponding part of the second semiconductor layer; and a second protection layer above the second gate electrode, one of the first source electrode and the first drain electrode is an extension of the second gate electrode, the data line is connected to an other of the first source electrode and the first drain electrode, the second protection layer is continuous from above the second gate electrode to above the one of the first source electrode and the first drain electrode, and the second gate electrode is thinner than the data line.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One or more exemplary embodiments or features disclosed herein allow the wiring to have low resistance and the flatness of the upper layer above the TFT to be easily ensured.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 14 is a schematic diagram illustrating a layout of a single pixel of a conventional thin-film semiconductor substrate.

FIG. 15 is a cross sectional view of the conventional thin-film semiconductor substrate along the line A-A' in FIG. 14.

FIG. 16 is a cross sectional view of a light-emitting panel in the case where an organic EL element is formed above the thin-film semiconductor substrate illustrated in FIG. 15.

Figure 1:
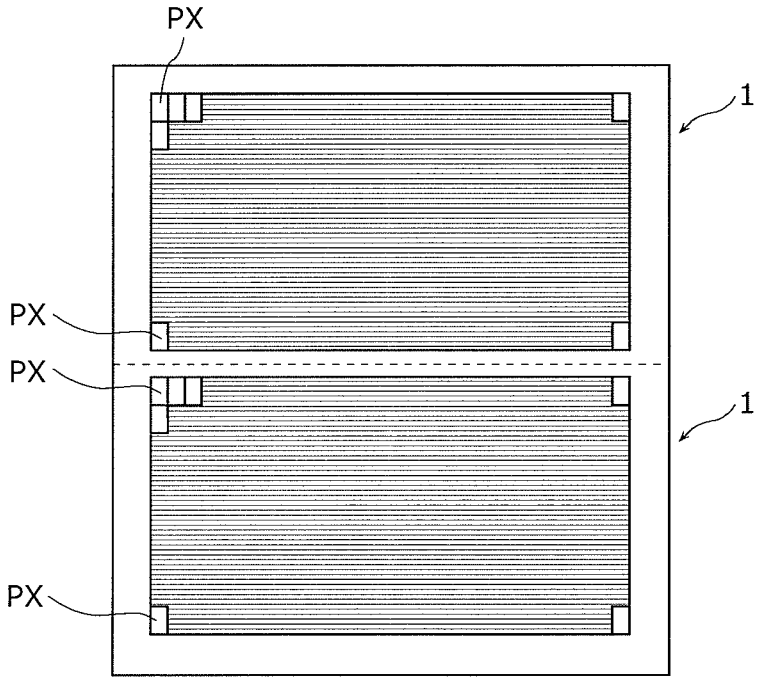
FIG. 1 is a plan view illustrating a schematic structure of a thin-film semiconductor array substrate according to Embodiment 1.

DESCRIPTION OF EMBODIMENTS (Underlying Knowledge Forming Basis of the Present Disclosure)

Ahead of the description of exemplary embodiments, circumstances that led to an aspect of the present disclosure will be described with reference to FIGS. 14 to 16. FIG. 14 is a schematic diagram illustrating a layout of a single pixel of a conventional thin-film semiconductor substrate. FIG. 15 is a cross sectional view along the line A-A' in FIG. 14. FIG. 16 is a cross sectional view of a light-emitting panel in the case where an organic EL element is formed above the thin-film semiconductor substrate illustrated in FIG. 15.

FIG. 14 illustrates an example of a pixel PX when the organic EL element is driven using a TFT having a top gate structure. As illustrated in FIG. 14, the conventional thin-film semiconductor array substrate 101 includes a gate line (scanning line) 131, a source line (data line) 132, a power line 133, a contact pad 150 connected to an electrode of an organic EL element (not illustrated), a first TFT 110, and a second TFT 120.

The first TFT 110, which is a switching transistor, includes a first gate electrode 110G connected to the gate line 131, a first source electrode 110S connected to the source line 132, and a first drain electrode 110D connected to a second gate electrode 120G of the second TFT 120 via a contact portion 160.

Moreover, the second TFT 120, which is a driving transistor, includes the second gate electrode 120G connected to the first drain electrode 110D of the first TFT 110, a second source electrode 120S connected to the contact pad 150, and a second drain electrode 120D connected to the power line 133.

As illustrated in FIG. 15, the first TFT 110 has a top gate structure and a stacked structure including a first semiconductor layer (a channel layer) 111 formed above the substrate 161, a first gate insulating film 112 formed above the first semiconductor layer 111, and the first gate electrode 110G formed above the first gate insulating film 112.

Likewise, the second TFT 120 also has a top gate structure and a stacked structure including a second semiconductor layer (a channel layer) 121 formed above the substrate 161, a second gate insulating film 122 formed above the second semiconductor layer 121, and the second gate electrode 120G formed above the second gate insulating film 122.

Moreover, a passivation layer 164 is formed to cover the first gate electrode 110G and the second gate electrode 120G. In the first TFT 110, the first source electrode 110S and the first drain electrode 110D are connected to the first semiconductor layer 111 via a contact hole formed in the passivation layer 164. In the second TFT 120, the second source electrode 120S and the second drain electrode 120D are connected to the second semiconductor layer 121 via the contact hole formed in the passivation layer 164.

For example, the gate line 131 and the source line 132 have low resistance in view of a reduction of a load on the wiring. Moreover, for example, the power line 133 has low resistance in view of an improvement in evenness and a reduction of power consumption. Anyway, for example, the gate line 131, the source line 132, and the power line 133 have low resistance, and thus are generally formed to be thick. Specifically, the thicknesses of the gate line 131, the source line 132, and the power line 133 are 300 nm or more.

However, the gate line 131, the source line 132, and the power line 133 are often formed in the same process as the electrodes of the TFT. Therefore, when the gate line 131, the source line 132, and the power line 133 are formed to be thick, the electrodes of the TFT are also formed to be thick.

For example, in the thin-film semiconductor array substrate 101 illustrated in FIGS. 14 and 15, the source line 132 and the power line 133, the first source electrode 110S and the first drain electrode 110D in the first TFT 110, and the second source electrode 120S and the second drain electrode 120D in the second TFT 120 are formed in the same process. Thus, when the source line 132 and the power line 133 are formed to be thick, the first source electrode 110S and the first drain electrode 110D are formed to be thick, and the second source electrode 120S and the second drain electrode 120D are also formed to be thick.

As a result, in forming a layer (upper layer) such as an EL layer above the first TFT 110 and the second TFT 120, it is difficult to ensure the flatness of the upper layer.

For example, as illustrated in FIG. 16, in the case where a planarizing layer 170, an anode 181, an organic EL layer 182 including a light-emitting layer, a cathode 183, and a bank 190 are formed above the thin-film semiconductor array substrate 101 illustrated in FIG. 15 as the upper layer, it is difficult to form the anode 181 to be flat because the first drain electrode 110D and the second source electrode 120S, which have been formed in the same process as the source line 132 and the power line 133 and are thick, are present under the cathode 181.

When the anode 181 is not sufficiently flat, it is also difficult to evenly form the organic EL layer 182 above the anode 181. As a result, there arises a problem that an electrical field is concentrated on a part of the organic EL layer 182 and a voltage applied to the light-emitting layer becomes uneven, and thus the lifetime of the organic EL element is shortened.

In view of this, the electrodes of the first TFT 110 and the second TFT 120 such as the first drain electrode 110D and the second source electrode 120S can be formed to be thin, but this causes the source line 132 and the power line 133 formed in the same process as the electrodes to be thin, thereby increasing the resistance of the source line 132 and the power line 133.

Otherwise, after forming the gate line 131, the source line 132, and the electrodes of the first TFT 110 and the second TFT 120 in the same process, only the thickness of the electrodes of the first TFT 110 and the second TFT 120 can be decreased. However, an additional process for decreasing the thickness is needed in this method.

As described above, it is difficult to have both a flat upper layer of the TFT and the gate line 131, the source line 132, and the power line 133 having low resistance.

One non-limiting and exemplary embodiment provides a thin-film semiconductor substrate, a display panel, and a method of manufacturing the thin-film semiconductor substrate which allow the wiring connected to the TFT to have low resistance and the flatness of the upper layer above the TFT to be easily ensured.

In one aspect of the present disclosure, a thin-film semiconductor substrate includes: a substrate; a first semiconductor element and a second semiconductor element that are above the substrate; and a data line above the substrate, in which the first semiconductor element includes: a first semiconductor layer; a first gate insulating film above the first semiconductor layer; a first gate electrode above the first gate insulating film; a first source electrode and a first drain electrode each connected to a corresponding part of the first semiconductor layer; and a first protection layer above the first gate electrode, the second semiconductor element includes: a second semiconductor layer; a second gate insulating film above the second semiconductor layer; a second gate electrode above the second gate insulating film; a second source electrode and a second drain electrode each connected to a corresponding part of the second semiconductor layer; and a second protection layer above the second gate electrode, one of the first source electrode and the first drain electrode is an extension of the second gate electrode, the data line is connected to an other of the first source electrode and the first drain electrode, the second protection layer is continuous from above the second gate electrode to above the one of the first source electrode and the first drain electrode, and the second gate electrode is thinner than the data line.

In this way, the second gate electrode and the one of the first source electrode and the first drain electrode extending from the second gate electrode are thinner than the data line. With this, even though the data line is formed to be thick to have a low resistance, the flatness of the upper layer formed above the first semiconductor element and the second semiconductor element can be easily ensured because the second gate electrode of the second semiconductor element and the one of the electrodes of the first semiconductor element are thin.

Moreover, in one aspect of the present disclosure, the thin-film semiconductor substrate may further include a first gate line connected to the first gate electrode, in which the first gate electrode has approximately the same thickness as the first gate line, and is thinner than the data line.

In this way, the first gate electrode is thinner than the data line. With this, the flatness of the upper layer formed above the first semiconductor element and the second semiconductor element can be ensured more easily.

Moreover, in one aspect of the present disclosure, the thin-film semiconductor substrate may further include a second gate line stacked above the first gate line.

In this way, when the first gate electrode is formed to be thin and the first gate line having the same thickness as the first gate electrode is formed in the same process as the first gate electrode, the first gate line is also formed to be thin and has high resistance.

However, the resistance of the gate line can be substantially decreased because the second gate line is stacked on the first gate line. With this, in addition to the flat upper layer formed above the first semiconductor element and the second semiconductor element and low resistance of the data line, low resistance of the gate line can also be achieved.

Moreover, in one aspect of the present disclosure, the thin-film semiconductor substrate may further include a power line connected to one of the second source electrode and the second drain electrode, in which the power line has approximately the same thickness as the data line.

In this way, since the thickness of the power source line is approximately the same as the thickness of the data line, it is possible to form the power line and the data line in the same process. With this, the power line can also be formed to be thick, and therefore the power line can also have low resistance.

Moreover, in one aspect of the present disclosure, a light-emitting panel includes: the thin-film semiconductor substrate according to any one of the above aspects; an anode above the thin-film semiconductor substrate; a light-emitting layer above the anode; a cathode above the light-emitting layer; and a bank that sandwiches the light-emitting layer laterally, in which the bank is disposed above the data line.

In this way, the anode and the light-emitting layer are formed above the thin-film semiconductor substrate in which the second gate electrode and the one of the first source electrode and the first drain electrode extending from the second gate electrode are thinner than the data line. With this, a flatness of the anode and the light-emitting layer can be ensured, thereby uniforming the voltage applied to the light-emitting layer. Thus, the lifetime of the light-emitting panel can be elongated.

Moreover, in the light-emitting panel according to an aspect of the present disclosure, the bank has sidewalls with a two-stage shape.

In this way, when the material for the organic EL layer is printed inside the bank, it is possible to regulate the height of the material for the organic EL layer at the two-stage-shaped portion of the bank, thereby aligning the pinning position when the material for the organic EL layer is printed within the surface of the substrate. Thus, the thickness of the organic EL layer can be evened within the surface of the substrate.

Moreover, in the light-emitting panel according to an aspect of the present disclosure, when a region corresponding to the light-emitting layer sandwiched by the bank in a planar view of the light-emitting panel is a light-emitting region, (1) the first gate electrode and the one of the first source electrode and the first drain electrode in the first semiconductor element and the second gate electrode in the second semiconductor element are in the light-emitting region, and (2) the data line is outside the light-emitting region.

In this way, the second gate electrode and the one of the first source electrode and the first drain electrode extending from the second gate electrode are formed within the light-emitting region, and, on the other hand, the data line is formed outside the light-emitting region. With this, the electrodes of the first semiconductor element and the second semiconductor element can be formed to be thin within the light-emitting region, and the data line can be formed to be thick outside the light-emitting region. Thus, it is possible to have both the data line having low resistance and a flat upper layer without influencing a state of light emission.

In one aspect of the present disclosure, a method of manufacturing a thin-film semiconductor substrate includes: forming a first semiconductor layer and a second semiconductor layer above a substrate; forming a gate insulating layer above the first semiconductor layer and the second semiconductor layer; forming openings in the gate insulating layer to expose a portion of the first semiconductor layer and a portion of the second semiconductor layer; forming a first metal layer above the gate insulating layer to cover the portion of the first semiconductor layer and the portion of the second semiconductor layer exposed through the openings in the gate insulating layer; patterning the first metal layer to form a first gate electrode, a second gate electrode, one of a first drain electrode and a first source electrode, and one of a second drain electrode and a second source electrode; patterning the gate insulating layer using the patterned first metal layer as a mask pattern to form a first gate insulating film between the first semiconductor layer and the first gate electrode, and a second gate insulating film between the second semiconductor layer and the second gate electrode; forming a passivation layer above the first gate electrode, the first drain electrode, the second source electrode, and the second gate electrode; forming openings in the passivation layer to expose a portion of the first semiconductor layer and a portion of the second semiconductor layer; forming a second metal layer above the passivation layer to cover the portion of the first semiconductor layer and the portion of the second semiconductor layer exposed through the openings in the passivation layer, the second metal layer being thicker than the first metal layer; and patterning the second metal layer to form an other of the first drain electrode and the first source electrode, an other of the second drain electrode and the second source electrode, and a data line connected to the other of the first drain electrode and the first source electrode, in which, in the patterning the first metal layer, the first metal layer is patterned to form the one of the first drain electrode and the first source electrode and the second gate electrode connected with each other.

In this way, the second gate electrode and the one of the first source electrode and the first drain electrode which are all formed by patterning the same first metal layer are thinner than the data line formed by patterning the second metal layer. With this, even if the data line is formed to be thick to have low resistance, the second gate electrode and the one of the electrodes can be formed to be thin. Therefore, the flatness of the upper layer formed above the first semiconductor element and the second semiconductor element can be easily ensured.

Hereinafter, certain exemplary embodiments are described with reference to the accompanying Drawings. It is to be noted that each of the exemplary embodiments described below shows a general or specific example. The numerical values, shapes, materials, constituent elements, the arrangement and connection of the constituent elements, steps, the processing order of the steps etc. shown in the following exemplary embodiments are mere examples, and therefore do not limit the scope of the appended Claims and their equivalents. Therefore, among the constituent elements in the following exemplary embodiments, constituent elements not recited in any one of the independent claims indicating the most generic concept of the present disclosure are described as optional constituent elements.

It is to be noted that the diagrams are schematic diagrams, and not necessarily strictly accurate. Therefore, scale sizes, etc. in the diagrams do not necessarily match. Moreover, in the diagrams, the same reference signs are assigned to substantially the same configuration, and the descriptions for the overlapping part are omitted or simplified.

Embodiment 1

First, Embodiment 1 will be described. FIG. 1 is a plan view illustrating a schematic structure of a thin-film semiconductor array substrate according to Embodiment 1.

The thin-film semiconductor array substrate (TFT array substrate) according to this embodiment is an example of a thin-film semiconductor substrate, which is an active matrix substrate for manufacturing an organic EL display, for example.

As illustrated in FIG. 1, a thin-film semiconductor array substrate 1 includes a display unit in which plural pixels PX are arranged in a matrix.

It is to be noted that FIG. 1 illustrates a mother substrate for two thin-film semiconductor array substrates 1, and two thin-film semiconductor array substrates 1 can be obtained by cutting the mother substrate. Moreover, the pixel PX is illustrated only at a part of four corners of the display unit in FIG. 1, but in fact plural pixels PX are arranged in the display unit.

Figure 2:
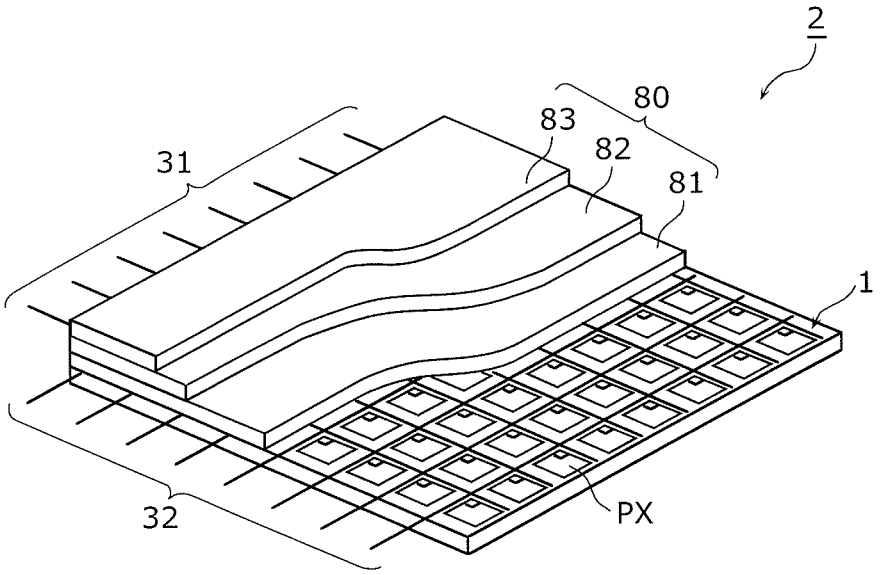
FIG. 2 is a partially cutaway perspective view of an organic EL display according to Embodiment 1.

FIG. 2 is a partially cutaway perspective view of the organic EL display according to Embodiment 1.

An organic EL display 2 is an example of a light-emitting panel and includes the thin-film semiconductor array substrate 1 having plural pixels PX included in a pixel circuit, an organic EL element 80 above the thin-film semiconductor array substrate 1 corresponding to the pixels PX, plural gate lines (scanning lines) 31 along the row direction of the pixels PX, plural source lines (data lines) 32 along the column direction of the pixels PX, and a power line 33 (not illustrated) in parallel with the source line 32.

The organic EL element 80 includes an anode 81, an organic EL layer 82 and a cathode 83 sequentially stacked above the thin-film semiconductor array substrate 1.

Figure 3:
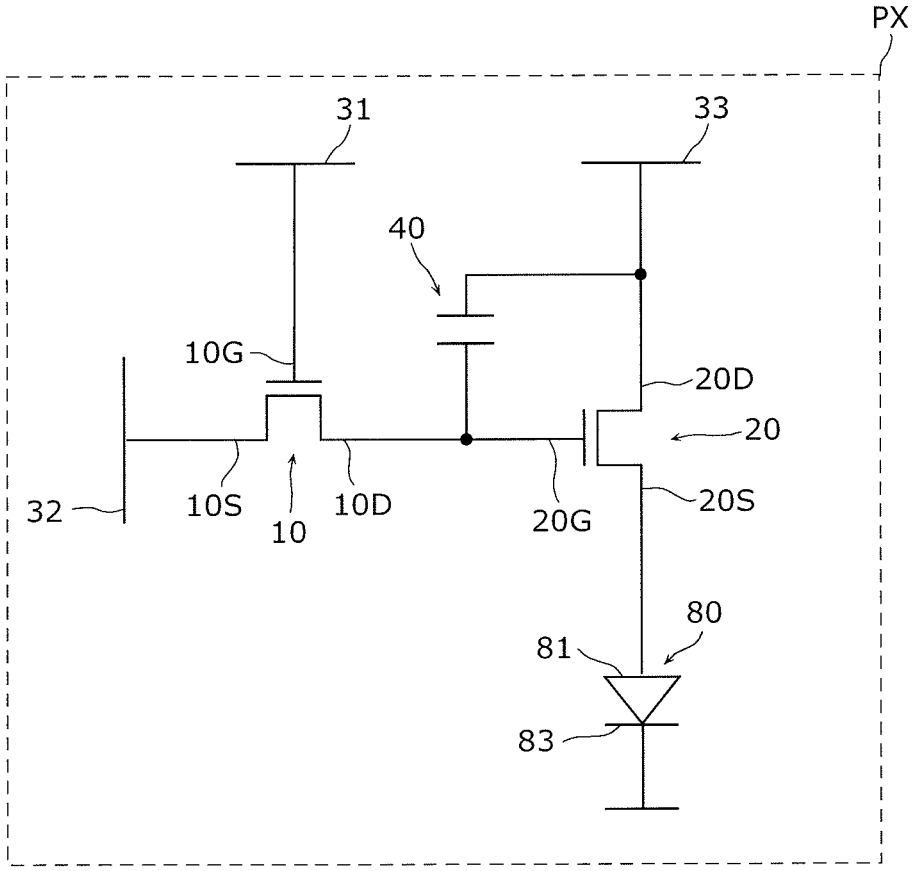
FIG. 3 is a diagram illustrating a circuit configuration of a pixel in the thin-film semiconductor array substrate according to Embodiment 1.

FIG. 3 is a diagram illustrating a circuit configuration of the pixel PX in the thin-film semiconductor array substrate 1 illustrated in FIGS. 1 and 2.

Each of the pixels PX includes a first TFT 10, a second TFT 20, a gate line 31, a source line 32, a power line 33, and a capacitor 40. In each pixel PX, the first TFT 10 is a switching transistor for selecting the pixel PX, and the second TFT 20 is a driving transistor for driving the pixel PX.

The first TFT 10 includes a first gate electrode 10G connected to the gate line 31, a first source electrode 10S connected to the source line 32, a first drain electrode 10D connected to the capacitor 40, and a second gate electrode 20G of the second TFT 20.

Moreover, the second TFT 20 includes the second gate electrode 20G connected to the first drain electrode 10D of the first TFT 10, a second source electrode 20S connected to the anode 81 of the organic EL element 80, and a second drain electrode 20D connected to the power line 33.

The gate line (scanning line) 31 supplies a timing signal (gate voltage) for writing a data voltage to a pixel circuit of each pixel PX included in a pixel row.

The source line (data line) 32 supplies, to the pixel circuit of the pixel PX included in a pixel column, a data voltage for determining an intensity of the light emission of the organic EL element 80 in each pixel PX.

The power line 33 supplies a power source voltage to the pixel circuit of each pixel PX included in a pixel row. In this embodiment, the power line 33 supplies the power source voltage to the second TFT 20 of each pixel PX.

The capacitor 40 is a retention capacitor for holding the data voltage supplied from the source line 32.

In the pixel PX configured as above, when the first TFT 10 enters an ON state after a gate signal is provided to the gate line 31, the data voltage (video signal voltage) supplied via the source line 32 is written into the capacitor 40. Subsequently, the data voltage written into the capacitor 40 is held for one frame period. The held data voltage causes conductance of the second TFT 20 to change in an analog manner, and a driving current corresponding to a light-emitting gradation flows from the anode 81 to the cathode 83 of the organic EL element 80 to cause the organic EL element 80 to emit light. With this, a predetermined image can be displayed.

It is to be noted that although a 2Tr1C pixel circuit including two TFTs and one capacitor is described as an example in this embodiment, the configuration of the pixel circuit is not limited to this. Moreover, a pixel circuit that is capable of correcting a threshold voltage of the TFT may be used.

Figure 4:
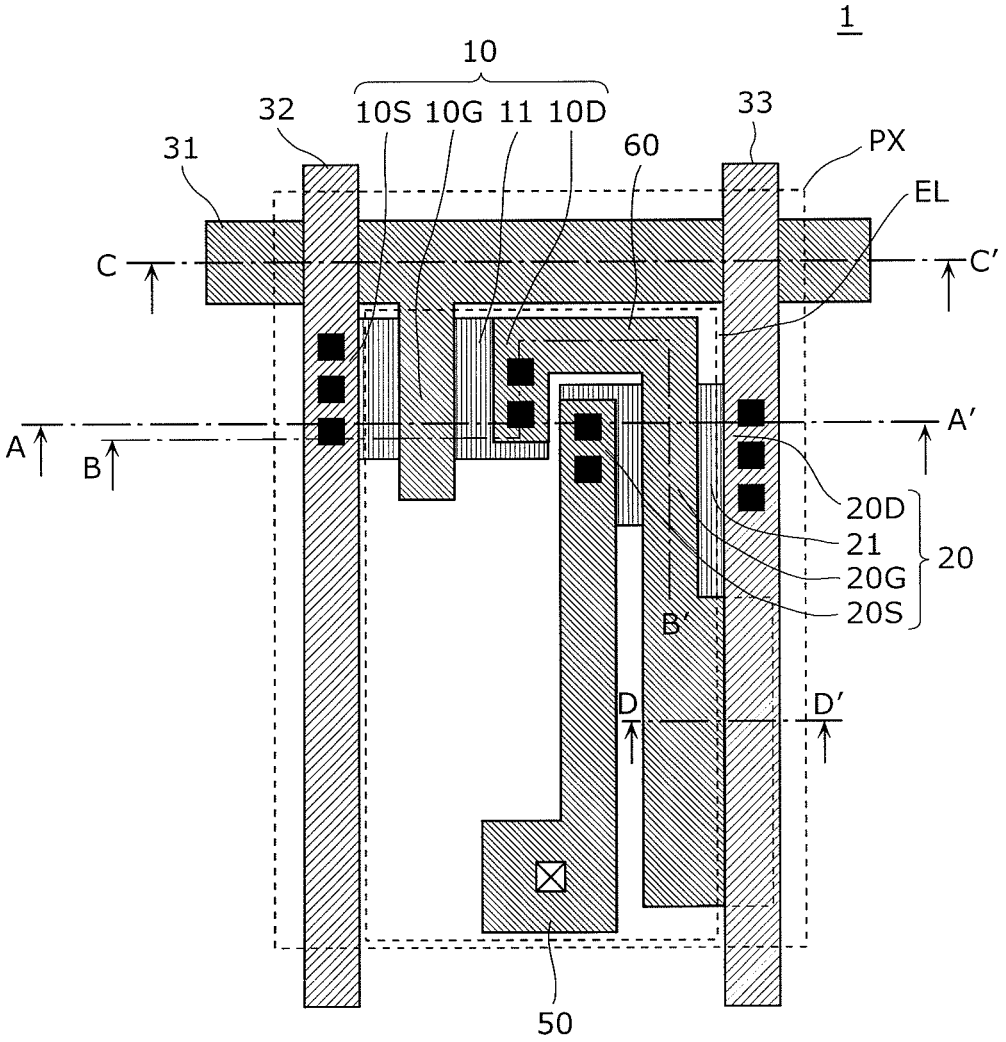
FIG. 4 is a schematic diagram illustrating a layout of a single pixel in the thin-film semiconductor array substrate according to Embodiment 1.
Figure 5A:
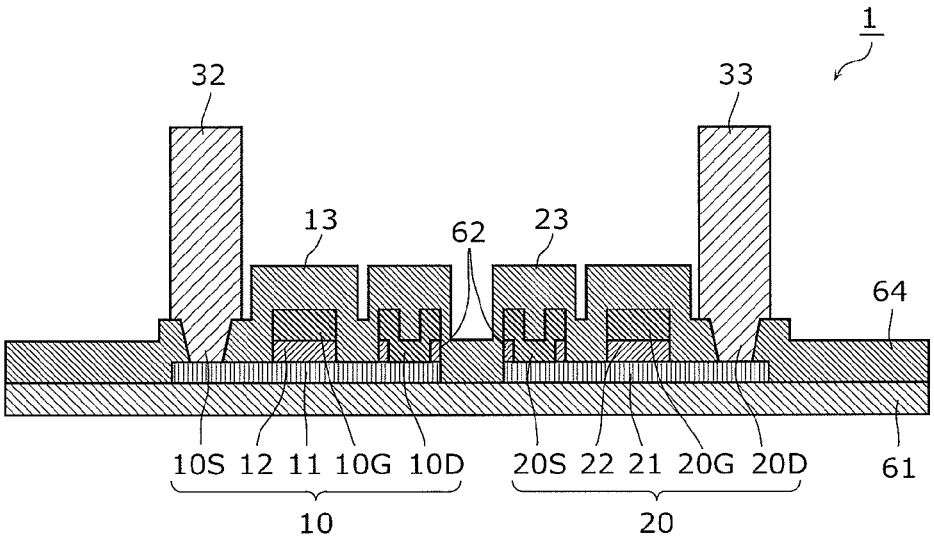
FIG. 5A is a cross sectional view of the thin-film semiconductor array substrate according to Embodiment 1 along the line A-A' in FIG. 4.
Figure 5B:
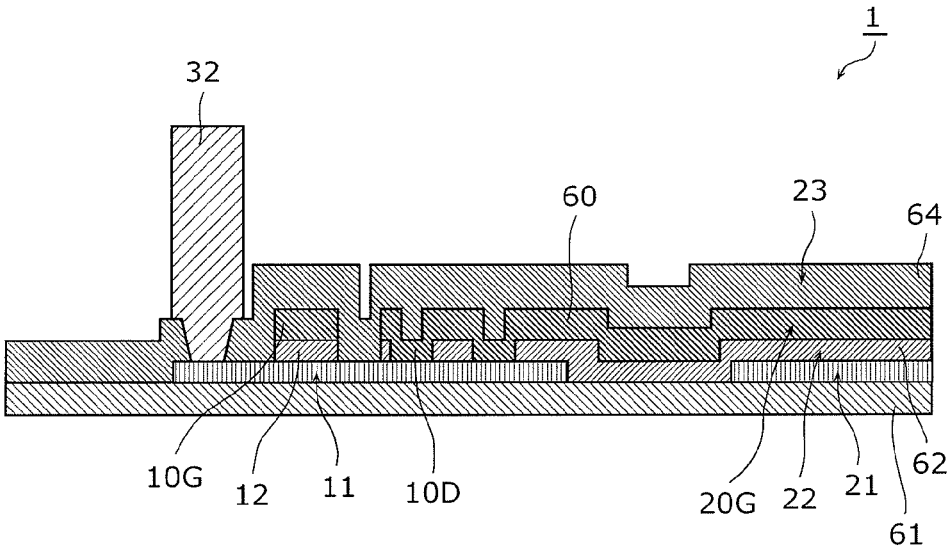
FIG. 5B is a cross sectional view of the thin-film semiconductor array substrate according to Embodiment 1 along the line B-B' in FIG. 4.
Figure 5C:
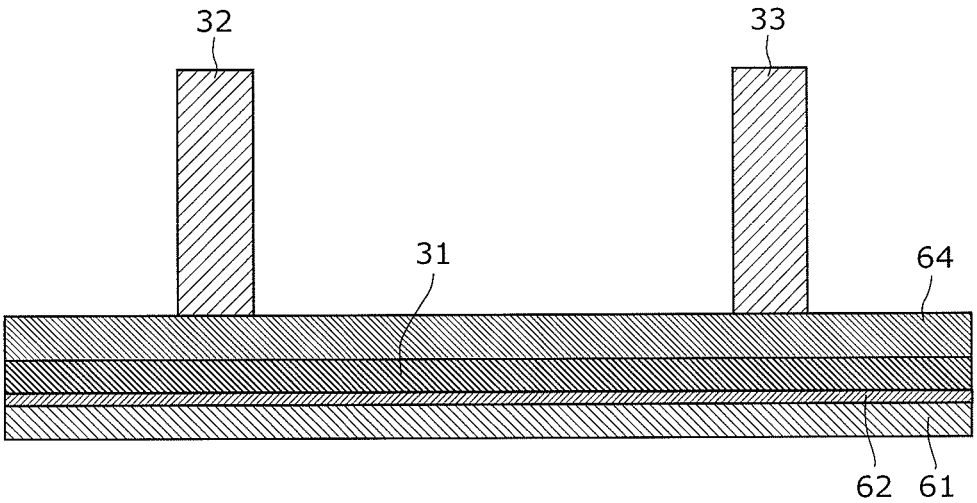
FIG. 5C is a cross sectional view of the thin-film semiconductor array substrate according to Embodiment 1 along the line C-C' in FIG. 4.
Figure 5D:
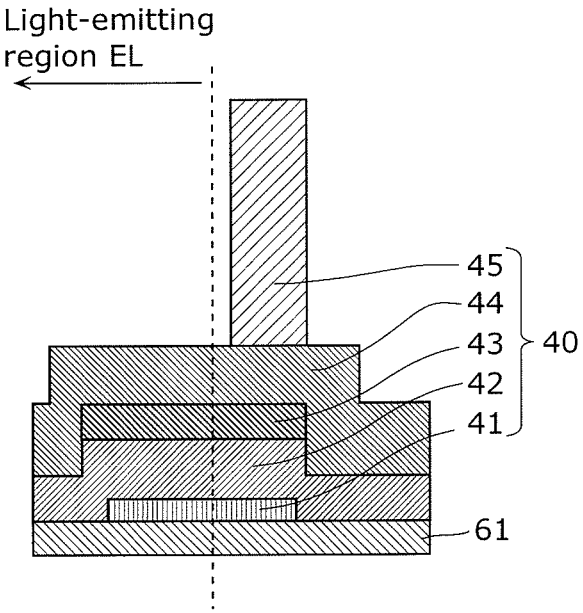
FIG. 5D is a cross sectional view of the thin-film semiconductor array substrate according to Embodiment 1 along the line D-D' in FIG. 4.

FIG. 4 is a schematic diagram illustrating a layout of a single pixel in the thin-film semiconductor array substrate according to Embodiment 1. FIG. 5A is a cross sectional view along the line A-A' in FIG. 4, FIG. 5B is a cross sectional view along the line B-B' in FIG. 4, FIG. 5C is a cross sectional view along the line C-C' in FIG. 4, and FIG. 5D is a cross sectional view along the line D-D' in FIG. 4. It is to be noted that, in FIG. 4, the region surrounded by the dotted line inside the pixel PX indicates a light-emitting region EL when the organic EL element is formed above the thin-film semiconductor array substrate 1.

As illustrated in FIG. 4, the pixel PX is partitioned by the gate line 31 and the source line 32 which are perpendicular to each other and each pixel PX includes the first TFT 10, the second TFT 20, the capacitor 40, and a contact pad 50. The contact pad 50 is connected to the anode 81 of the organic EL element 80 via a contact portion.

As illustrated in FIGS. 5A to 5D, the thin-film semiconductor array substrate 1 includes a substrate 61, the first TFT (a first semiconductor element) 10, and the second TFT (a second semiconductor element) 20 formed above the substrate 61. Moreover, above the substrate 61, the gate line 31, the source line 32, and the power line 33 are also formed.

As illustrated in FIG. 5A, the first TFT 10 has a top gate structure, and includes a first semiconductor layer (a channel layer) 11 above the substrate 61, a first gate insulating film 12 above the first semiconductor layer 11, the first gate electrode 10G above the first gate insulating film 12, the first source electrode 10S and the first drain electrode 10D connected to a part of the first semiconductor layer 11, and a first protection layer 13 above the first gate electrode 10G.

Moreover, the second TFT 20 has a top gate structure, and includes a second semiconductor layer (a channel layer) 21 above the substrate 61, a second gate insulating film 22 above the second semiconductor layer 21, the second gate electrode 20G above the second gate insulating film 22, the second source electrode 20S and the second drain electrode 20D connected to a part of the second semiconductor layer 21, and a second protection layer 23 above the second gate electrode 20G.

As illustrated in FIGS. 4 and 5A, the source line 32 is connected to the first source electrode 10S in the first TFT 10. In this embodiment, the source line 32 and the first source electrode 10S are integrated; a part of the source line 32 constitutes the first source electrode 10S.

Moreover, the power line 33 is connected to the second drain electrode 20D in the second TFT 20. In this embodiment, the power line 33 and the second drain electrode 20D are integrated; a part of the power line 33 constitutes the second drain electrode 20D.

As illustrated in FIG. 5A, the first gate insulating film 12 and the second gate insulating film 22 are formed of the same gate insulating layer 62, and formed in the same process. Moreover, the first protection layer 13 and the second protection layer 23 are formed of the same passivation layer 64, and formed in the same process.

The passivation layer 64 is formed to continuously cover the first gate electrode 10G, the first drain electrode 10D, the second source electrode 20S, and the second gate electrode 20G. In other words, the first protection layer 13 is continuously formed from a region above the first gate electrode 10G to a region above the second gate electrode 20G across a region above the first drain electrode 10D and a region above the second source electrode 20S. Likewise, the second protection layer 23 is continuously formed from the region above the second gate electrode 20G to the region above the first gate electrode 10G across the region above the second source electrode 20S and the region above the first drain electrode 10D.

Thus, a top face of the second gate electrode 20G in a region above the second semiconductor layer 21, a top face of the first gate electrode 10G in a region above the first semiconductor layer 11, and a top face of a portion between the region above the second semiconductor layer 21 and the region above the first semiconductor layer 11 are in contact with the passivation layer 64 which is a continuous film.

As illustrated in FIGS. 4 and 5B, the first drain electrode 10D in the first TFT 10 is an extension of the second gate electrode 20G in the second TFT 20. Specifically, the first drain electrode 10D and the second gate electrode 20G are connected by a relay electrode 60 formed in the same layer as the first drain electrode 10D and the second gate electrode 20G. That is, the first drain electrode 10D and the second gate electrode 20G are connected without the contact portion (a contact hole) therebetween. The relay electrode 60 is a connecting electrode for connecting the first drain electrode 10D and the second gate electrode 20G.

It is to be noted that, as illustrated in FIG. 4, the contact pad 50 is an extension of the second source electrode 20S of the second TFT 20.

Moreover, as illustrated in FIG. 4, the gate line 31 is formed to cross the source line 32 and the power line 33. The first gate electrode 10G in the first TFT 10 is an extension of a part of the gate line 31. Moreover, as illustrated in FIG. 5C, the passivation layer 64 is formed between the gate line 31 and the source line 32, and between the gate line 31 and the power line 33.

In the thin-film semiconductor array substrate 1 configured as above, the first gate electrode 10G, the first drain electrode 10D, the second source electrode 20S, the second gate electrode 20G, the gate line 31, the contact pad 50, and the relay electrode 60 are formed by patterning a common metal layer (a first metal layer). Therefore, the first gate electrode 10G, the first drain electrode 10D, the second source electrode 20S, the second gate electrode 20G, the gate line 31, the contact pad 50, and the relay electrode 60 have approximately the same thickness except for an error in manufacturing.

Moreover, the source line 32 and the power line 33 are formed by patterning a common second metal layer formed above the first metal layer. Therefore, the source line 32 and the power line 33 have approximately the same thickness except for an error in manufacturing.

In this embodiment, the first metal layer is thinner than the second metal layer. That is, the first gate electrode 10G, the first drain electrode 10D, the second source electrode 20S, the second gate electrode 20G, the gate line 31, the contact pad 50, and the relay electrode 60 are thinner than the source line 32 and the power line 33.

Thus, the first gate electrode 10G and the first drain electrode 10D in the first TFT 10, and the second source electrode 20S and the second gate electrode 20G in the second TFT 20 can be formed to be thin, while the source line 32 and the power line 33 can be formed to be thick.

Moreover, as illustrated in FIGS. 4 and 5D, the capacitor 40 has a metal-insulator-semiconductor structure (MIS) including a semiconductor layer 41, an insulating film 42, and a first metal film 43, and a metal-insulator-metal (MIM) structure including the first metal film 43, an insulating film 44, and a second metal film 45. It is to be noted that, in FIG. 4, the capacitor 40 has the MIS structure including the semiconductor layer 41, the insulating film 42, and the first metal film 43 in the region surrounded by the dotted lines inside the pixel PX (the light-emitting region EL when the organic EL element is formed above the thin-film semiconductor array substrate 1).

The semiconductor layer 41 is formed by patterning the same semiconductor material as the first semiconductor layer 11 and the second semiconductor layer 21. Moreover, the insulating film 42 is formed by patterning the same insulating material as the first gate insulating film 12 and the second gate insulating film 22. Moreover, the first metal film 43 is formed by patterning the same first metal layer as the first gate electrode 10G and the second gate electrode 20G. Moreover, the insulating film 44 is formed by patterning the same insulating material as the passivation layer 64. Moreover, the second metal film 45 is formed by patterning the same metal layer as the source line 32 and the power line 33.

With the thin-film semiconductor array substrate 1 according to this embodiment as described above, even in a pixel PX including a top-gate TFT, the electrodes of the first TFT 10 (the first gate electrode 10G and the first drain electrode 10D) and the electrodes of the second TFT 20 (the second gate electrode 20G and the second source electrode 20S) can be formed to be thin within the pixel PX. As a result, the flatness of the upper layer formed above the first TFT 10 and the second TFT 20 is easily ensured.

Moreover, in this embodiment, the electrodes of the first TFT 10 and the second TFT 20, the source line 32, and the power line 33 are formed of different layers. With this, even though the electrodes of the first TFT 10 and the second TFT 20 are formed to be thin, the source line 32 and the power line 33 can be formed to be thick. Accordingly, the source line 32 and the power line 33 can be formed to be thick and thus to have low resistance, so that a signal delay can be suppressed and unevenness of luminance due to a voltage drop can be suppressed.

As described above, according to this embodiment, the wiring connected to the TFT in the pixel PX can have low resistance and the flatness of the upper layer above the TFT can be easily ensured.

Moreover, in this embodiment, the capacitor 40 has a MIS structure in which the first metal film 43, which is thin, serves as a metal electrode in the light-emitting region EL in the case where the organic EL element is formed above the thin-film semiconductor array substrate 1. In this regard, the first metal film 43 is formed in the same layer as the first gate electrode 10G (the first metal layer). Moreover, the layers constituting the capacitor 40 does not include the source line 32 and the power line 33 (the second metal layer) which are thick. As a result, the flatness of the upper layer formed above the first TFT 10 and the second TFT 20 is easily ensured.

Figure 6:
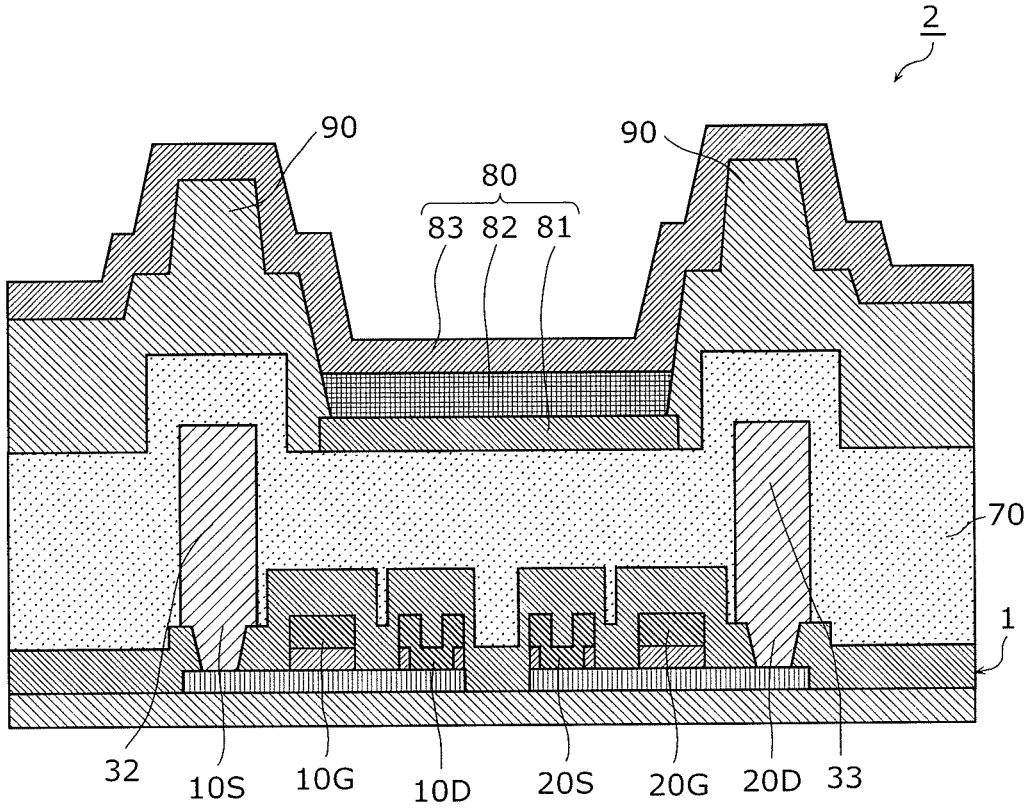
FIG. 6 is a cross sectional view illustrating a structure of the organic EL display according to Embodiment 1.

Next, a cross-sectional structure of the organic EL display 2 in this embodiment will be described with reference to FIG. 6. FIG. 6 is a cross sectional view illustrating a structure of the organic EL display according to this embodiment when the organic EL element 80 is formed above the thin-film semiconductor array substrate 1 illustrated in FIG. 5A.

As illustrated in FIG. 6, the organic EL display 2 according to this embodiment is a top-emission display panel, and includes the thin-film semiconductor array substrate 1, a planarizing layer 70 formed above the thin-film semiconductor array substrate 1, and the organic EL element 80, and a bank 90 formed above the planarizing layer 70.

The organic EL element 80 is a light-emitting element including a light-emitting layer, and emits light as a result of a driving current corresponding to a data voltage flows via the second TFT 20. The organic EL element 80 includes the anode 81 formed above the planarizing layer 70, the organic EL layer 82 formed above the anode 81, and the cathode 83 formed above the organic EL layer 82. The bank (bank layer) 90 sandwiches the organic EL layer 82 laterally.

The anode 81 includes, for example, a reflecting electrode having light reflectivity.

The organic EL layer 82 can be formed of an organic material, and includes a hole injection layer, a hole transport layer, a light-emitting layer, the electron transport layer, the electron injection layer, and the like stacked. The organic EL layer 82 is formed inside an opening of the bank 90.

As the cathode 83, for example, a transparent metal oxide such as an indium tin oxide (ITO) or an indium zinc oxide (IZO) can be used.

The anode 81 and the organic EL layer 82 are formed corresponding to the pixel PX in the thin-film semiconductor array substrate 1. The organic EL layer 82 includes the light-emitting layer, and serves as the light-emitting region EL in the pixel PX.

The bank 90 is positioned above the source line 32 and the power line 33. That is, the organic EL layer 82 sandwiched by the bank 90 is formed in a region between the source line 32 and the power line 33 in a process described below. The width of the bank 90 is greater than the widths of the source line 32 and the power line 33.

It is to be noted that the bank 90 may be a pixel bank surrounding the organic EL layer 82 for each pixel PX, or may be a line bank surrounding the organic EL layer 82 shared by plural pixels PX aligned in a column direction.

In the organic EL display 2 according to this embodiment as described above, the organic EL element 80 is formed corresponding to the pixel PX in the above-mentioned thin-film semiconductor array substrate 1, and a thick layer (the source line 32 and the power line 33) is not formed, but only a thin layer (electrodes of the first TFT 10 and the second TFT 20) is formed under the region where the anode 81 and the organic EL layer 82 are formed.

Accordingly, a difference in level (protrusion and depression) in the pixel PX can be planarized successfully by the planarizing layer 70. Thus, the anode 81 and the organic EL layer 82 can be easily formed to be flat without increasing the thickness of the planarizing layer 70. As a result, it is possible to uniform the voltage applied to the light-emitting layer, thereby elongating the lifetime of the organic EL element 80.

In this embodiment, in a planar view of the organic EL display 2, the electrodes of the first TFT 10 (the first gate electrode 10G and the first drain electrode 10D) and the electrodes of the second TFT 20 (the second gate electrode 20G and the second source electrode 20S) are formed inside the light-emitting region EL, while the source line 32 and the power line 33 are formed outside the light-emitting region EL as illustrated in FIG. 4.

With this, the electrodes of the first TFT 10 and the electrodes of the second TFT 20 can be formed to be thin inside the light-emitting region EL, while the wiring (the source line 32 and the power line 33) are formed to be thick outside the light-emitting region EL. Therefore, it is possible to have both the wiring having low resistance and a flat upper layer (the anode 81 and the organic EL layer 82) without affecting a light-emitting state of the organic EL element 80.

Moreover, in this embodiment, a thick wiring layer is not included in the capacitor 40 in the light-emitting region EL of each pixel PX as described above. With this, the anode 81 can be formed to be flat more easily, thereby further elongating the lifetime of the organic EL element 80.

Moreover, in this embodiment, the bank 90 is formed above the source line 32 and the power line 33 which are thick. Therefore, the height of the bank 90 can be easily increased, which is depending on the thickness of the planarizing layer 70, though. That is, the bank 90 can be easily formed to be tall by utilizing the source line 32 and the power line 33 which are tall. With this, when the material for the organic EL layer 82 is formed by a printing method such as an ink jet printing, more liquid drops can be applied inside the bank 90, thereby improving evenness in the thickness of the organic EL layer 82.

Furthermore, as illustrated in FIG. 6, an edge of the bank 90 can be positioned more inside than the source line 32 and the power line 33 which are thick by making the width of the bank 90 greater than the width of the source line 32 and the power line 33. With this, sidewalls of the bank 90 can be formed to have a two-stage shape, so that the height of the material for the organic EL layer 82 can be regulated at the two-stage-shaped portion of the bank 90 when the material for the organic EL layer 82 is applied in the opening portion of the bank 90 by the ink-jet printing. Thus, a pinning position within the surface of the substrate can be aligned at the time of the ink-jet printing, thereby improving the evenness in the thickness of the organic EL layer 82 within the surface of the substrate. As a result, the evenness of the luminance can be improved.

Figure 7:
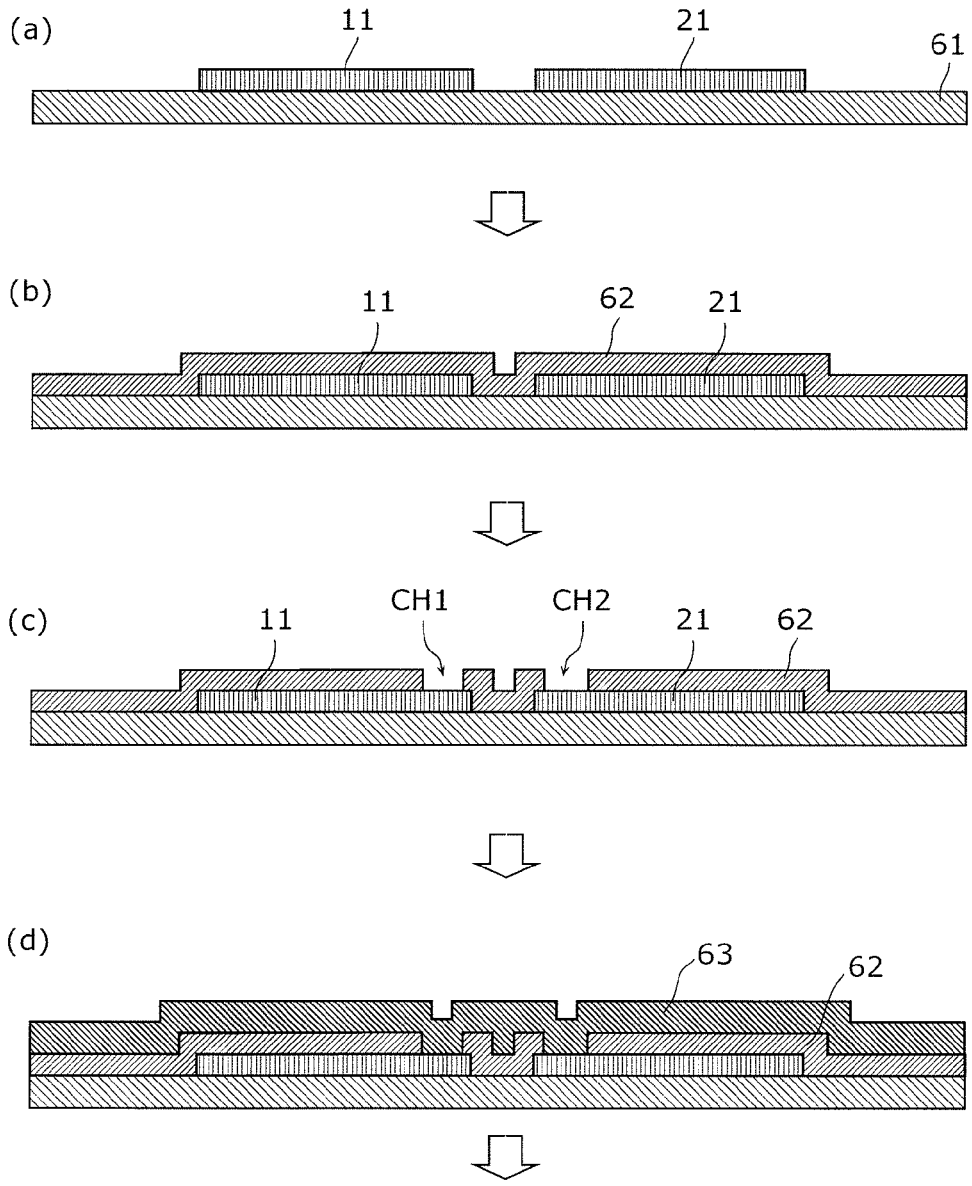
FIG. 7 is a diagram illustrating processes (a-d) of a method of manufacturing the thin-film semiconductor array substrate according to Embodiment 1.
Figure 8:
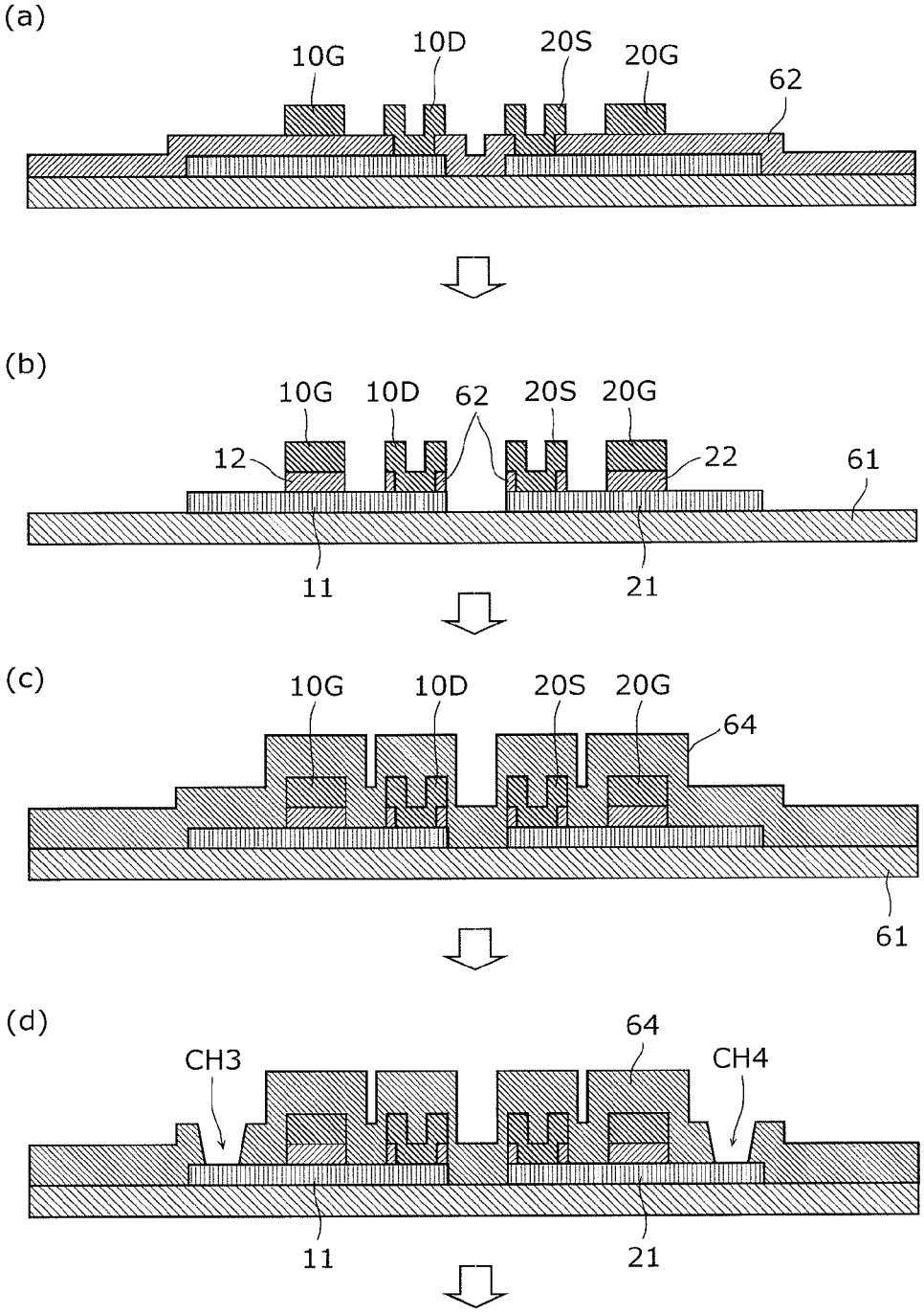
FIG. 8 is a diagram illustrating processes (a-d) of the method of manufacturing the thin-film semiconductor array substrate according to Embodiment 1.
Figure 9:
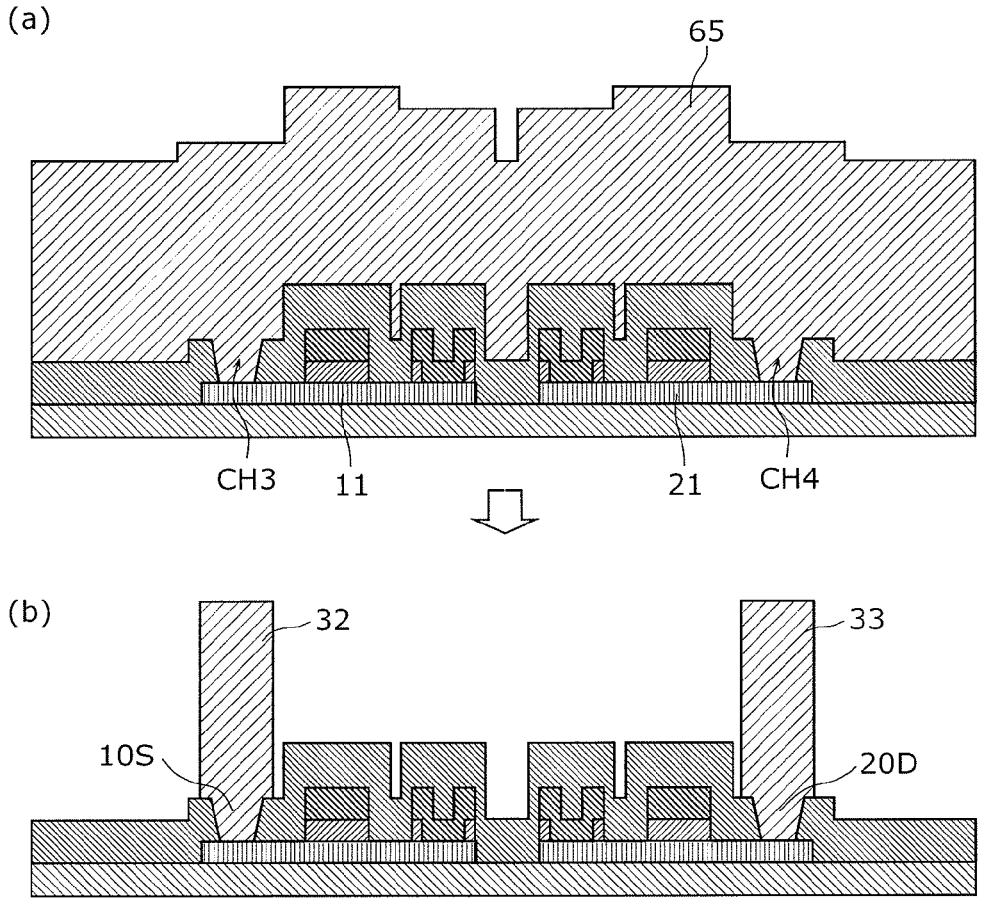
FIG. 9 is a diagram illustrating processes (a and b) of the method of manufacturing the thin-film semiconductor array substrate according to Embodiment 1.

Next, a method of manufacturing the thin-film semiconductor array substrate 1 according to Embodiment 1 will be described with reference to FIGS. 7 to 9. FIGS. 7 to 9 are diagrams illustrating processes of the method of manufacturing the thin-film semiconductor array substrate 1 according to Embodiment 1.

First, as illustrated in (a) in FIG. 7, the first semiconductor layer 11 and the second semiconductor layer 21 are formed above the substrate 61.

Specifically, the substrate 61 is prepared at first. The substrate 61 is, for example, a glass substrate made of a glass material such as quarts glass, alkali-free glass, and high heat resistant glass. An undercoat layer including a silicon nitride film ($SiN_x$), a silicon oxide film ($SiO_y$), or silicon oxynitride film ($SiO_yN_x$) may be formed above the substrate 61 in order to prevent impurity such as sodium and phosphorus included in the glass substrate from entering the first semiconductor layer 11 and the second semiconductor layer 21. Furthermore, because an oxide semiconductor is sensitive to hydrogen (H), aluminum oxide ($Al_yO_x$) may be formed as an undercoat layer in order to suppress an influence of hydrogen (H). The undercoat layer has a thickness of approximately 100 to 2000 nm, for example.

Subsequently, a semiconductor film is formed above the substrate 61 by sputtering. As a semiconductor material for forming the semiconductor film, an oxide semiconductor material such as In—Ga—Zn—O (IGZO), In-Tin-Zn—O (ITZO), Zn—O (ZnO), In—Ga—Zn—O (IGO), and IZO (In—Zn—O) can be used. It is to be noted that the semiconductor material is not limited to the above in implementation of the structure for easily causing inside the pixel PX to be flat as described above. As the semiconductor material, a material that is able to realize a top-gate TFT is sufficient; crystal silicon such as amorphous silicon and polysilicon, a Si nanowire, a carbon nanotube, grapheme, etc. may be used.

After the semiconductor film is formed using the above semiconductor material, the first semiconductor layer 11 and the second semiconductor layer 21 are formed by patterning to have predetermined shapes in a desired region by a common photolithography or etching technique. At this time, the semiconductor layer 41 of the capacitor 40 illustrated in FIG. 5D is also formed. It is to be noted that the semiconductor film has a thickness of approximately 10 to 300 nm, for example.

In this embodiment, the first semiconductor layer 11 and the second semiconductor layer 21 are formed using IGZO.

Subsequently, as illustrated in (b) in FIG. 7, the gate insulating layer (a first inter-layer insulating film) 62 is formed above the first semiconductor layer 11 and the second semiconductor layer 21. As the gate insulating layer 62, oxide silicon can be formed by CVD, for example. The oxide silicon can be formed by introducing silane gas ($SiH_4$) and nitrous oxide ($N_2O$) at a predetermined concentration ratio. Other than oxide silicon, silicon nitride, silicon oxide nitride, or a stacked layer of the silicon nitride and the silicon oxide nitride may be stacked. The gate insulating layer 62 has a thickness of approximately 50 to 400 nm, for example.

Subsequently, as illustrated in (c) in FIG. 7, the gate insulating layer 62 is patterned. In this embodiment, openings are formed in the gate insulating layer 62 by photolithography or etching to expose a portion of each of the first semiconductor layer 11 and the second semiconductor layer 21.

For example, openings are formed in portions of the gate insulating layer 62 to form a first contact hole CH1 and a second contact hole CH2 using a gas such as sulfur hexafluoride (SF), corresponding to portions to be a region of the first drain electrode 10D in the first TFT 10 and a region of the second source electrode 20S in the second TFT 20, to expose a surface of a portion of the first semiconductor layer 11 and a surface of a portion of the second semiconductor layer 21.

Subsequently, as illustrated in (d) in FIG. 7, a first metal layer 63 which is a thin-film metal layer is formed above the gate insulating layer 62 so as to cover the portions of the first semiconductor layer 11 and the second semiconductor layer 21 exposed through the openings in the gate insulating layer 62.

As the first metal layer 63, it is sufficient that a material for constituting a gate electrode is used. For example, aluminum (Al), molybdenum (Mo), tungsten (W), molybdenum-tungsten (MoW), copper (Cu), titanium (Ti), chromium (Cr), or the like can be used. In this embodiment, a MoW film is formed by sputtering as the first metal layer 63. Moreover, the first metal layer 63 has a thickness of approximately 20 to 100 nm, for example.

Subsequently, as illustrated in (a) in FIG. 8, the first metal layer 63 is patterned by photolithography and etching. With this, the first gate electrode 10G, the first drain electrode 10D, the second source electrode 20S, the second gate electrode 20G, and the gate line 31 (not illustrated) are formed in predetermined shapes. At this time, as illustrated in FIG. 4, the first metal layer 63 is patterned such that the first drain electrode 10D and the second gate electrode 20G are continuously connected.

Subsequently, as illustrated in (b) in FIG. 8, the gate insulating layer 62 is patterned using the patterned first metal layer 63 as a mask pattern to form the first gate insulating film 12 between the first semiconductor layer 11 and the first gate electrode 10G and to form the second gate insulating film 22 between the second semiconductor layer 21 and the second gate electrode 20G.

In this embodiment, the gate insulating layer 62 is patterned by photolithography and etching using the first gate electrode 10G, the first drain electrode 10D, the second source electrode 20S, the second gate electrode 20G, and the gate line 31 (not illustrated) as masks. With this, the gate insulating layer 62 in regions directly under the first gate electrode 10G, the first drain electrode 10D, the second source electrode 20S, the second gate electrode 20G, and the gate line 31 remains. That is, the gate insulating layer 62 in the other regions is removed. With this processing of the gate insulating layer 62, the first gate insulating film 12 and the second gate insulating film 22 having predetermined shapes are formed and a portion of the first semiconductor layer 11 and a portion of the second semiconductor layer 21 are exposed.

It is to be noted that after the processing of the gate insulating layer 62, the first semiconductor layer 11 and the second semiconductor layer 21, which are oxide semiconductor layers, may be processed to have low resistance. With this, it is possible to cause the exposed portions of the first semiconductor layer 11 and the second semiconductor layer 21, which is regions not covered with the first metal layer 63 in the first semiconductor layer 11 and the second semiconductor layer 21 (an offset region), to have low resistance, thereby providing reliable TFT characteristics.

Subsequently, as illustrated in (c) in FIG. 8, the passivation layer (the second inter-layer insulating film) 64 is formed above the first gate electrode 10G, the first drain electrode 10D, the second source electrode 20S, and the second gate electrode 20G.

In this embodiment, the passivation layer 64 is formed over the entire substrate 61 so as to cover the first gate electrode 10G, the first drain electrode 10D, the second source electrode 20S, the second gate electrode 20G, and the gate line 31 (not illustrated).

As the passivation layer 64, for example, oxide silicon can be formed by CVD. In this case, the oxide silicon can be formed by introducing silane gas ($SiH_4$) and nitrous oxide ($N_2O$) at a predetermined concentration ratio. Other than oxide silicon, silicon nitride, silicon oxide nitride, or a stacked layer of the silicon nitride and the silicon oxide nitride may be stacked. Otherwise, aluminum oxide may be formed. The passivation layer 64 has a thickness of approximately 50 to 400 nm, for example.

Subsequently, as illustrated in (d) in FIG. 8, openings are formed in portions of the passivation layer 64 by photolithography and etching to expose a portion of each of the first semiconductor layer 11 and the second semiconductor layer 21.

For example, openings are formed in portions of the passivation layer 64 to form a third contact hole CH3 and a fourth contact hole CH4, corresponding to portions to be a region of the first source electrode 10S in the first TFT 10 and a region of the second drain electrode 20D in the second TFT 20, to expose a surface of a portion of the first semiconductor layer 11 and a surface of a portion of the second semiconductor layer 21.

Subsequently, as illustrated in (a) in FIG. 9, a second metal layer 65, which is a thick metal layer, is formed above the passivation layer 64 so as to cover the portions of the first semiconductor layer 11 and the second semiconductor layer 21 exposed through the openings in passivation layer 64. That is, the second metal layer 65 is formed so as to fill the third contact hole CH3 and the fourth contact hole CH4. Here, the second metal layer 65 is formed to be thicker than the first metal layer 63.

As the second metal layer 65, it is sufficient that a material for constituting wiring is used. For example, aluminum (Al), molybdenum (Mo), tungsten (W), molybdenum-tungsten (MoW), copper (Cu), titanium (Ti), chromium (Cr), or the like can be used. In this embodiment, the second metal layer 65 is formed by stacking three layers of MoW/Al/MoW through sputtering. Moreover, the second metal layer 65 has a thickness of approximately 300 to 800 nm, for example.

Subsequently, as illustrated in (b) in FIG. 9, the second metal layer 65 is patterned by photolithography and etching. With this, the first source electrode 10S, the source line 32 connected to the first source electrode 10S, the second drain electrode 20D, and the power line 33 connected to the second drain electrode 20D are formed in predetermined shapes.

Thus, the thin-film semiconductor array substrate 1 as illustrated in FIGS. 4 and 5A to 5D can be manufactured.

Subsequently, although not shown, the organic EL display 2 as illustrated in FIG. 6 can be manufactured by forming the planarizing layer 70, the bank 90, the anode 81, the organic EL layer 82, and the cathode 83 above the thin-film semiconductor array substrate 1.

Figure 10:
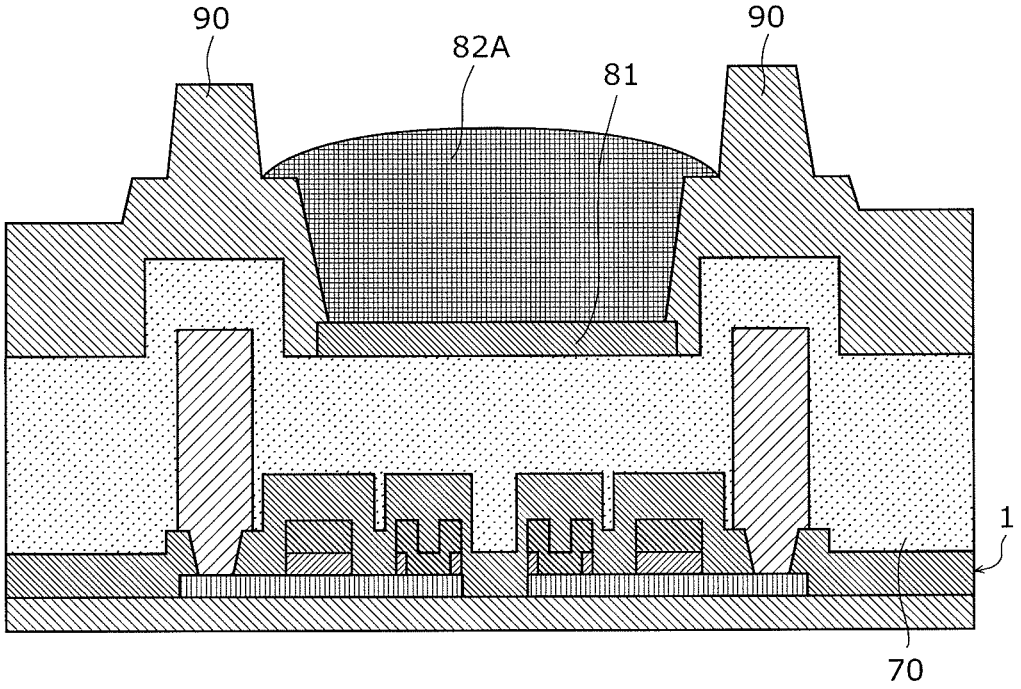
FIG. 10 is a diagram for illustrating the method of manufacturing the organic EL display according to Embodiment 1.

Hereinafter, a method of manufacturing the organic EL display 2 according to this embodiment will be simply described using the above FIG. 6 with reference to FIG. 10. FIG. 10 is a diagram for illustrating a method of manufacturing an organic EL display according to Embodiment 1.

Specifically, at first, the planarizing layer 70 is formed to cover the entire thin-film semiconductor array substrate 1 as illustrated in FIGS. 6 and 10.

Subsequently, a contact hole (not illustrated) penetrating the planarizing layer 70 is formed by photolithography and etching. The contact hole turns to be a through hole for connecting the anode 81 and the contact pad 50 (see FIG. 4) in order to electrically connect the anode 81 of the organic EL element 80 and the second source electrode 20S.

Subsequently, as illustrated in FIGS. 6 and 10, the bank 90 is formed at a position corresponding to a boundary of each pixel PX above the planarizing layer 70. Moreover, the anode 81 is formed above the planarizing layer 70 in the opening of the bank 90 for each pixel PX. At this time, the contact hole in the planarizing layer 70 is filled with a material for the anode 81, thereby forming the contact portion. The anode 81 and the second source electrode 20S are electrically connected via the contact portion and the contact pad 50.

It is to be noted that the material for the anode 81 is, for example, a conductive metal such as molybdenum, aluminum, gold, silver, and copper, an alloy of such conductive metals, an organic conductive material such as PEDOT:PSS, zinc oxide, or lead additive indium oxide. A film made of such a material is formed by vacuum vapor deposition, electron beam deposition, sputtering, or printing, and an electrode pattern having a predetermined shape is formed.

Subsequently, as illustrated in FIG. 6, the organic EL layer 82 including the light-emitting layer is formed. The organic EL layer 82 is formed above the anode 81 in the opening of the bank 90 for each pixel PX. As described above, the organic EL layer 82 includes the hole injection layer, the hole transport layer, the light-emitting layer, an electron transport layer, an electron injection layer, and the like that are stacked. For example, copper phthalocyanine may be used as the hole injection layer, α-NPD (Bis[N-(1-naphthyl)-N-phenyl]benzidine) may be used as the hole transport layer, $Alq_3$ (tris(8-hydroxyquinoline)aluminum) may be used as the light-emitting layer, oxazole derivative may be used as the electron transport layer, and $Alq_3$ may be used as the electron injection layer. It is to be noted that these materials are mere examples, and other materials may be used.

An organic material 82A of each layer in the organic EL layer 82 can be printed in the opening of the bank 90 by ink-jet printing, for example. At this time, in this embodiment, since the sidewalls of the bank 90 have a two-stage shape as illustrated in FIG. 10, the height of the organic material 82A can be regulated at the two-stage-shaped portion of the bank 90. With this, the pinning positions of the organic materials 82A can be aligned among the pixels PX, so that the thickness of the organic EL layer 82 can be easily evened within the surface of the substrate. It is to be noted that after the organic material 82A is applied, each layer in the organic EL layer 82 having a predetermined thickness can be formed through thermal treatment.

Subsequently, as illustrated in FIG. 6, the cathode 83 is formed so as to be shared by all the pixels PX. The cathode 83 is a translucent electrode continuously formed above the whole organic EL layer 82. The material for the cathode 83 may be ITO or IZO as described above. However, for example, $SnO_2$, $In_2O_3$, ZnO, or a combination of $SnO_2$, $In_2O_3$, and ZnO may be used instead of ITO or IZO.

Thus, the organic EL display 2 as illustrated in FIG. 6 can be provided.

Embodiment 2

Figure 11:
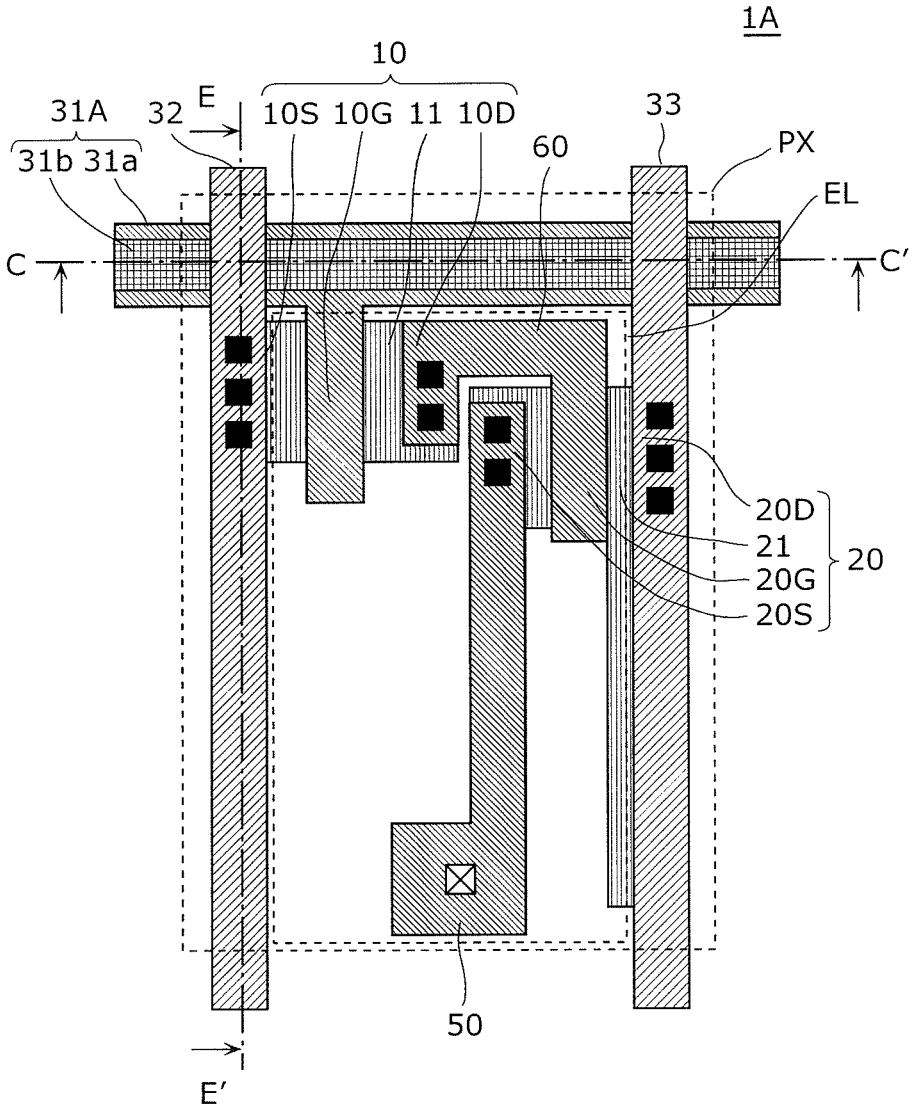
FIG. 11 is a schematic diagram illustrating a layout of a single pixel in a thin-film semiconductor array substrate according to Embodiment 2.
Figure 12A:
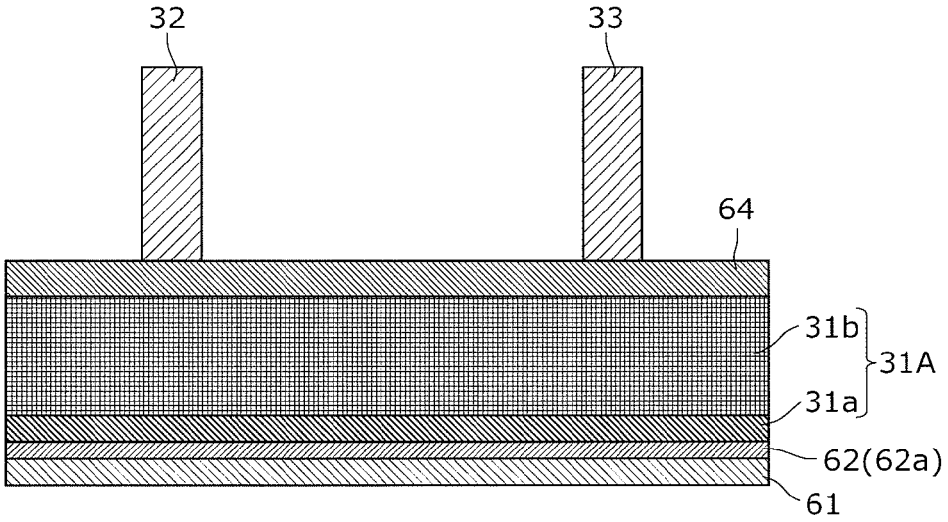
FIG. 12A is a cross sectional view of the thin-film semiconductor array substrate according to Embodiment 2 along the line C-C' in FIG. 11.
Figure 12B:
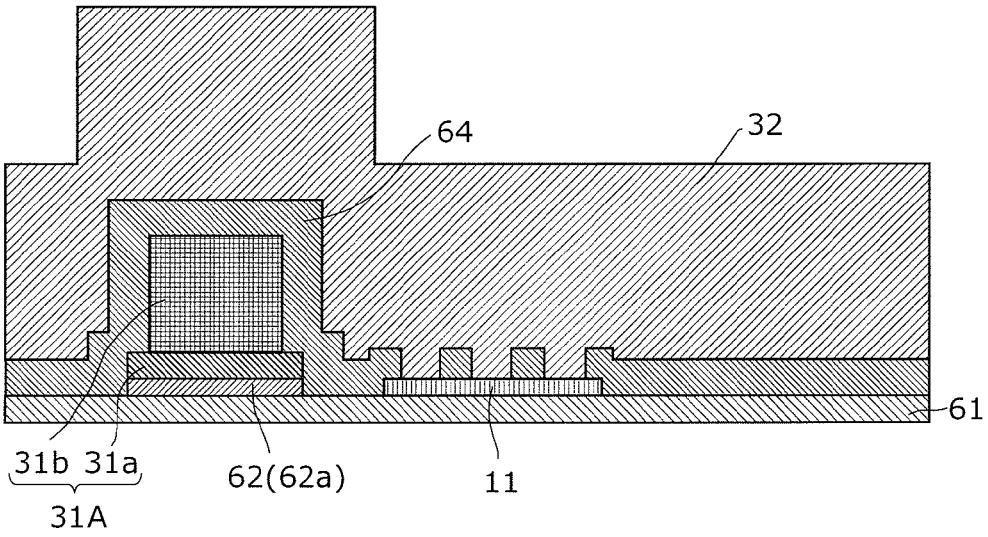
FIG. 12B is a cross sectional view of the thin-film semiconductor array substrate according to Embodiment 2 along the line E-E' in FIG. 11.

Next, a thin-film semiconductor array substrate 1A and an organic EL display according to Embodiment 2 are described with reference to FIGS. 11, 12A, and 128. FIG. 11 is a schematic diagram illustrating a layout of a pixel in the thin-film semiconductor array substrate according to Embodiment 2 and corresponds to FIG. 4. FIG. 12A is a cross sectional view along the line C-C' in FIG. 11, and FIG. 12B is cross sectional view along the line E-E' in FIG. 11. It is to be noted that descriptions shared with Embodiment 1 omitted and differences from Embodiment 1 will mainly be described.

As illustrated in FIGS. 11, 12A, and 12B, in the thin-film semiconductor array substrate 1A according to Embodiment 2, the gate line 31A includes plural metal layers. The gate line 31A in this embodiment has a stacked structure of two metal films including a lower first gate line 31a and an upper second gate line 31b. That is, when the thin-film gate line 31 in Embodiment 1 is assumed to be the first gate line 31a, the gate line 31A has a structure in which the second gate line 31b is stacked above the first gate line 31a.

Furthermore, in this embodiment, the second gate line 31b is thicker than the first gate line 31a. Moreover, the second gate line 31b is formed of a metal material having a composition different from a composition of the first gate line 31a. In this embodiment, a Ti film is formed as the first gate line 31a which is thin, and a three-layer film of MoW/Al/MoW is formed as the second gate line 31b which is thick. It is to be noted that the material of the second gate line 31b is, for example, a metal material having low resistance and may be the same material as a material of the gate line 31 in Embodiment 1.

When the gate line 31A having a two-layer structure is formed, a lower metal layer which is to be the first gate line 31a and an upper metal layer which is to be the second gate line 31b may be successively formed, and then the lower metal layer and the upper metal layer may be patterned through a half tone process using a half tone mask. With this, only the lower metal layer (Ti) remains in the electrodes of the first TFT 10 and the second TFT 20, and the upper metal layer (Ti) and the upper electrode layer (MoW/Al/MoW) are stacked in the gate line 31A.

Moreover, in this embodiment, the upper second gate line 31b is formed by wet etching and the lower first gate line 31a is formed by dry etching. Therefore, in the gate line 31A, the upper second gate line 31b has a width smaller than the width of the lower first gate line 31a as illustrated in FIG. 12B.

The thin-film semiconductor array substrate 1A in this embodiment can be manufactured by the same method as Embodiment 1 except for the manufacture of the gate line 31A. Moreover, the organic EL display according to this embodiment can be manufactured by the same method as Embodiment 1.

It is to be noted that the metal layer for forming the second gate line layer 32b is formed only above the first gate line layer 32a. That is, the first gate electrode 10G, the first drain electrode 10D, the second source electrode 20S, and the second gate electrode 20G are made of only the first metal layer (the metal layer of the first gate line layer 32a) as in Embodiment 1, and the metal layer for forming the second gate line layer 32b is not formed above these electrodes.

The gate line 31A configured as above can have resistance lower than the resistance of the gate line 31 in Embodiment 1 in proportion to the increase in the thickness of the gate line 31A compared to the gate line 31 in Embodiment 1. With this, signal transmissibility in the gate line can be improved compared to Embodiment 1, thereby improving image quality. The following describes in detail in this regard.

Because the gate line 31 in Embodiment 1 is formed of the same metal layer (the first metal layer) as the first gate electrode 10G which is desired to be thin, the gate line 31 in Embodiment 1 is formed to be thin. That is, the gate line 31 has to be formed to be thin due to the limitation of the thickness of the first gate electrode 10G, etc. Therefore, it is difficult for the gate line 31 to have low resistance by increasing the thickness like the source line 32 and the power line 33. Therefore, a signal delay can occur in the gate line 31 in Embodiment 1.

On the other hand, because the gate line 31A having the two-layer structure is used in this embodiment, even when the first gate line 31a is formed of the same metal layer (the first metal layer) as the first gate electrode 10G, etc. as in the gate line 31 in Embodiment 1, the resistance of the gate line can be substantially decreased as the second gate line 31b is stacked above the first gate line 31a. With this, the signal delay in the gate line can be suppressed compared to Embodiment 1.

With the thin-film semiconductor array substrate 1A according to this embodiment as described above, it is possible to decrease the resistance of the gate line while maintaining the structure for easily causing the inside of the pixel to be flat even in the case of a top gate TFT. That is, in addition to the flat upper layer formed above the first TFT 10 and the second TFT 20 and low resistance of the source line 32 and the power line 33, low resistance of the gate line 31A can also be achieved.

Moreover, in this embodiment, the second gate line 31b is thicker than the first gate line 31a. With this, the resistance of the gate line 31A can be further lowered.

Moreover, in this embodiment, the gate line 31 is formed by a half tone process. With this, the gate line 31A having low resistance can be formed without increasing mask processes compared to Embodiment 1.

Moreover, in this embodiment, since the gate insulating layer 62 is patterned using the first gate electrode 10G, the first drain electrode 10D, the second source electrode 20S, the second gate electrode 20G, and the first gate line 31a as masks (see (b) in FIG. 8) as in Embodiment 1, as illustrated in FIGS. 12A and 12B, the insulating layer 62a having the same width as the first gate line 31a is formed under the first gate line 31a.

Although the source line 32 needs to cross over the insulating layer 62a, the first gate line 31a, and the second gate line 31b, difference in level in the above stacked structure is great because the insulating layer 62a is formed under the gate line 31a in this embodiment. Therefore, the difference in level in the stacked structure decreases the thickness of the passivation layer 64 to cause disconnection of the passivation layer 64 at a step portion, and thus the source line 32 and the gate line 31A may be short-circuited.

Figure 13:
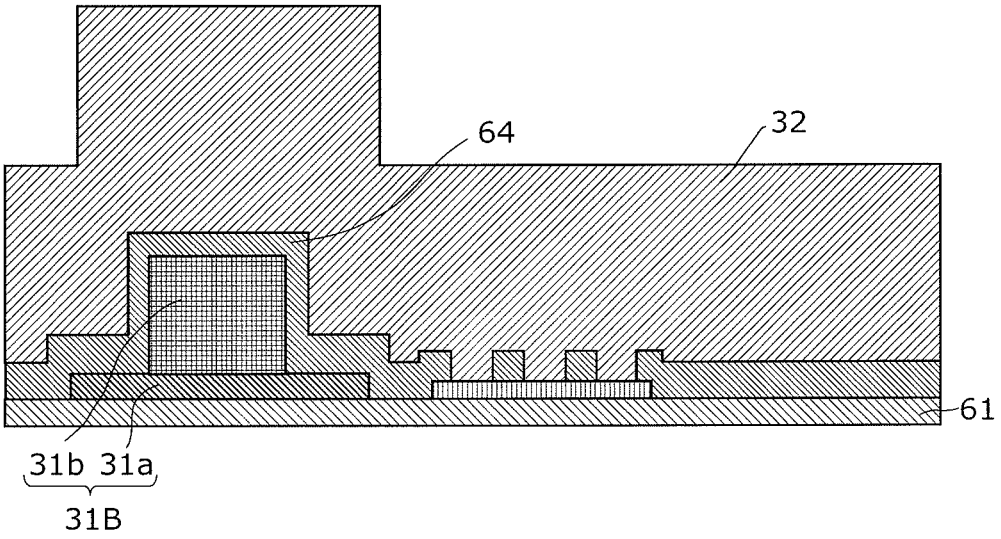
FIG. 13 is a cross sectional view illustrating a structure of a thin-film semiconductor array substrate according to a variation of Embodiment 2.

In order to avoid the short circuit, the gate line may have the structure as illustrated in FIG. 13. FIG. 13 is a cross sectional view illustrating a structure of a thin-film semiconductor array substrate according to a variation of Embodiment 2 and corresponds to the cross sectional view in FIG. 12B.

As illustrated in FIG. 13, in this variation, the gate line 31B is configured by forming the first gate line 31a above the substrate 61. With this, the difference in level in the stacked structure including the first gate line 31a and the second gate line 31b can be reduced. Therefore, a probability of short-circuit between the source line 32 and the gate line 31B can be reduced.

It is to be noted that when the gate line 31B having the structure illustrated in FIG. 13 is formed, the insulating layer 62a is not patterned using the first gate line 31a as a mask but patterned before the first gate line 31a is formed.

Specifically, the insulating layer 62a may be formed in the patterning process of the gate insulating layer 62 illustrated in (c) in FIG. 7. Thus, since the patterning process of the gate insulating layer 62 ((c) in FIG. 7) is included in this embodiment, the gate line 31B having the structure illustrated in FIG. 13 can be formed without adding a manufacturing process.

(Others)

Although the description has been given of the thin-film semiconductor array substrate, the method of manufacturing the thin-film semiconductor array substrate, and the light-emitting panel, the present disclosure is not limited to the above embodiments.

For example, in the above embodiments, the source electrode and the drain electrode may be switched according to a type of the TFT. Specifically, in the first TFT 10, the first source electrode 10S may serve as the first drain electrode 10D, and the first drain electrode 10D may serve as the first source electrode 10S. Moreover, in the second TFT 20, the second source electrode 20S may serve as the second drain electrode 20D, and the second drain electrode 20D may serve as the second source electrode 20S.

Moreover, although an example of the thin-film semiconductor array substrate applied to the organic EL display (light-emitting panel) including the organic EL element has been described in the above embodiment, the present disclosure is not limited to this example. For example, the thin-film semiconductor array substrate in the above embodiments can be widely used as an active matrix substrate, and also applicable to another active matrix display panel such as a liquid crystal display panel, etc.

Various modifications to the embodiments and the variations that are conceived by the person skilled in the art and other embodiments obtainable by arbitrarily combining the constituent elements and functionalities in the embodiments and the variations without materially departing from the scope of the present disclosure are included within the scope of the present disclosure.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

One or more exemplary embodiments disclosed herein are widely applicable to a display device such as a flat panel display used in a television set, a personal computer, and a cellular phone, a solid-state imaging device such as a digital camera, or other various electric appliances.

The invention claimed is:

1. A thin-film semiconductor substrate, comprising:
a substrate;
a first semiconductor element and a second semiconductor element that are above the substrate; and
a data line above the substrate,
wherein the first semiconductor element includes:
a first semiconductor layer;
a first gate insulating film above the first semiconductor layer;
a first gate electrode above the first gate insulating film;
a first source electrode and a first drain electrode each connected to a corresponding part of the first semiconductor layer; and
a first protection layer above the first gate electrode, the second semiconductor element includes:
a second semiconductor layer;
a second gate insulating film above the second semiconductor layer;
a second gate electrode above the second gate insulating film;
a second source electrode and a second drain electrode each connected to a corresponding part of the second semiconductor layer; and
a second protection layer above the second gate electrode,
one of the first source electrode and the first drain electrode is an extension of the second gate electrode,
*the second gate electrode is formed of a same layer as the one of the first source electrode and the first drain electrode,*
the data line is connected to an other of the first source electrode and the first drain electrode,
the second protection layer is continuous from above the second gate electrode to above the one of the first source electrode and the first drain electrode, and
the second gate electrode is thinner than the data line.

2. The thin-film semiconductor substrate according to claim 1, further comprising
a first gate line connected to the first gate electrode,
wherein the first gate electrode has approximately the same thickness as the first gate line, and is thinner than the data line.

3. The thin-film semiconductor substrate according to claim 2, further comprising
a second gate line stacked above the first gate line.

4. The thin-film semiconductor substrate according to claim 1, further comprising
a power line connected to one of the second source electrode and the second drain electrode,
wherein the power line has approximately the same thickness as the data line.

5. A light-emitting panel, comprising:
the thin-film semiconductor substrate according to claim 1;
an anode above the thin-film semiconductor substrate;
a light-emitting layer above the anode;
a cathode above the light-emitting layer; and
a bank that sandwiches the light-emitting layer laterally,
wherein the bank is disposed above the data line.

6. The light-emitting panel according to claim 5,
wherein the bank has sidewalls with a two-stage shape.

7. The light-emitting panel according to claim 5,
wherein, when a region corresponding to the light-emitting layer sandwiched by the bank in a planar view of the light-emitting panel is a light-emitting region, (1) the first gate electrode and the one of the first source electrode and the first drain electrode in the first semiconductor element and the second gate electrode in the second semiconductor element are in the light-emitting region, and (2) the data line is outside the light-emitting region.

8. A method of manufacturing a thin-film semiconductor substrate, the method comprising:
forming a first semiconductor layer and a second semiconductor layer above a substrate;
forming a gate insulating layer above the first semiconductor layer and the second semiconductor layer;
forming openings in the gate insulating layer to expose a portion of the first semiconductor layer and a portion of the second semiconductor layer;
forming a first metal layer above the gate insulating layer to cover the portion of the first semiconductor layer and the portion of the second semiconductor layer exposed through the openings in the gate insulating layer;
patterning the first metal layer to form a first gate electrode, a second gate electrode, one of a first drain electrode and a first source electrode, and one of a second drain electrode and a second source electrode;
patterning the gate insulating layer using the patterned first metal layer as a mask pattern to form a first gate insulating film between the first semiconductor layer and the first gate electrode, and a second gate insulating film between the second semiconductor layer and the second gate electrode;
forming a passivation layer above the first gate electrode, the first drain electrode, the second source electrode, and the second gate electrode;
forming openings in the passivation layer to expose a portion of the first semiconductor layer and a portion of the second semiconductor layer;
forming a second metal layer above the passivation layer to cover the portion of the first semiconductor layer and the portion of the second semiconductor layer exposed through the openings in the passivation layer, the second metal layer being thicker than the first metal layer; and
patterning the second metal layer to form an other of the first drain electrode and the first source electrode, an other of the second drain electrode and the second source electrode, and a data line connected to the other of the first drain electrode and the first source electrode,
wherein, in the patterning the first metal layer, the first metal layer is patterned to form the one of the first drain electrode and the first source electrode and the second gate electrode connected with each other, *and*

*wherein the second gate electrode is formed of a same layer as the one of the first drain electrode and the first source electrode.*

*9. A light-emitting panel, comprising:*

*a substrate;*

*a first semiconductor element and a second semiconductor element that are above the substrate;*

*a data line above the substrate;*

*an anode;*

*a cathode;*

*a light-emitting layer,*

*wherein*

*the first semiconductor element includes:*

*a first semiconductor layer;*

*a first gate insulating film above the first semiconductor layer;*

*a first gate electrode above the first gate insulating film; and*

*a first source electrode and a first drain electrode each connected to a corresponding part of the first semiconductor layer,*

*the second semiconductor element includes:*

*a second semiconductor layer;*

*a second gate insulating film above the second semiconductor layer;*

*a second gate electrode above the second gate insulating film; and*

*a second source electrode and a second drain electrode each connected to a corresponding part of the second semiconductor layer,*

*the first semiconductor element and the second semiconductor element are electrically connected to each other,*

*the data line is connected to one of the first source electrode and the first drain electrode,*

*an other of the first source electrode and the first drain electrode is thinner than the data line,*

*a wiring electrically connecting the first semiconductor element and the second semiconductor element extends in a first wiring layer,*

*the data line extends in a second wiring layer, and*

*the second wiring layer is disposed above the first wiring layer.*

*10. The light-emitting panel according to claim 9, further comprising*

*a power line connected to one of the second source electrode and the second drain electrode,*

*wherein an other of the second source electrode and the second drain electrode is below the light-emitting layer, or is closer to a region below the light-emitting layer than the one of the second source electrode and the second drain electrode, and*

*the other of the second source electrode and the second drain electrode is thinner than the data line.*

*11. The light-emitting panel according to claim 9,*

*wherein the first semiconductor element further includes a first protection layer above the first gate electrode,*

*the second semiconductor element further includes a second protection layer above the second gate electrode, and*

*the second protection layer is continuous from above the second gate electrode to above the one of the first source electrode and the first drain electrode.*

*12. The light-emitting panel according to claim 9,*

*wherein the one of the first source electrode and the first drain electrode is connected to the second gate electrode.*

*13. The thin-film semiconductor substrate according to claim 1, wherein*

*the one of the first drain electrode and the first source electrode, and the second gate electrode are connected by a wiring that is formed in the same layer as the second gate electrode and the one of the first drain electrode and the first source electrode.*

*14. The thin-film semiconductor substrate according to claim 1, wherein, when a region corresponding to a light-emitting layer sandwiched by a bank in a planar view of the thin-film semiconductor substrate is a light-emitting region, (1) the first gate electrode and the one of the first source electrode and the first drain electrode in the first semiconductor element and the second gate electrode in the second semiconductor element are in the light-emitting region, and (2) the data line is outside the light-emitting region.*

*15. The light-emitting panel according to claim 9, wherein in a planar view of the light-emitting panel, (1) the first gate electrode and the other of the first source electrode and the first drain electrode in the first semiconductor element overlap in the light-emitting layer, and (2) the data line does not overlap the light-emitting layer.*

* * * * *